(12) United States Patent
Wada

(10) Patent No.: US 8,507,908 B2
(45) Date of Patent: Aug. 13, 2013

(54) PROBE AND PROBE CARD

(75) Inventor: Koichi Wada, Tokyo (JP)

(73) Assignee: Advantest Corporation, Tokyo (JP)

( * ) Notice: Subject to any disclaimer, the term of this patent is extended or adjusted under 35 U.S.C. 154(b) by 137 days.

(21) Appl. No.: 12/667,084

(22) PCT Filed: Jul. 3, 2007

(86) PCT No.: PCT/JP2007/063314
§ 371 (c)(1),
(2), (4) Date: Dec. 29, 2009

(87) PCT Pub. No.: WO2009/004722
PCT Pub. Date: Jan. 8, 2009

(65) Prior Publication Data
US 2010/0176829 A1    Jul. 15, 2010

(51) Int. Cl.
*H01L 23/58* (2006.01)

(52) U.S. Cl.
USPC .............. 257/48; 257/E21.521; 257/E21.522; 257/E21.523; 257/E21.524; 438/18

(58) Field of Classification Search
USPC ........ 257/48, E21.521–24; 324/754; 438/18
See application file for complete search history.

(56) References Cited

U.S. PATENT DOCUMENTS

| | | | |
|---|---|---|---|
| 6,211,691 B1 * | 4/2001 | Okuno | 324/755.01 |
| 6,420,884 B1 | 7/2002 | Khoury et al. | |
| 6,436,802 B1 * | 8/2002 | Khoury | 438/612 |
| 6,466,043 B2 | 10/2002 | Khoury et al. | |
| 6,472,890 B2 | 10/2002 | Khoury et al. | |
| 6,535,003 B2 * | 3/2003 | Aldaz et al. | 324/755.01 |
| 6,957,405 B2 * | 10/2005 | Saunders et al. | 438/18 |
| 2001/0050565 A1 | 12/2001 | Petersen et al. | |
| 2002/0089342 A1 | 7/2002 | Khoury et al. | |
| 2002/0089343 A1 | 7/2002 | Khoury et al. | |
| 2002/0153909 A1 | 10/2002 | Petersen et al. | |
| 2004/0056674 A1 | 3/2004 | Petersen et al. | |
| 2007/0024297 A1 * | 2/2007 | Ismail et al. | 324/754 |

FOREIGN PATENT DOCUMENTS

| | | |
|---|---|---|
| JP | 2000-249722 | 9/2000 |
| JP | 2001-159642 | 6/2001 |
| JP | 2002-520596 | 7/2002 |
| JP | 2003-509695 | 3/2003 |
| JP | 2005-300501 | 10/2005 |
| WO | 03/071289 | 8/2003 |

OTHER PUBLICATIONS

China Office action, mail date is Jun. 8, 2011.
U.S. Appl. No. 12/667,071 to Wada, which was filed Dec. 29, 2009.
U.S. Appl. No. 12/670,247 to Kitazume et al., which was filed Jan. 22, 2010.
Taiwan Office action, mail date is Jan. 4, 2012.

* cited by examiner

*Primary Examiner* — Thao Le
*Assistant Examiner* — Matthew Gordon
(74) *Attorney, Agent, or Firm* — Greenblum & Bernstein, P.L.C.

(57) ABSTRACT

A probe comprises: contact parts to be electrically connected to input/output terminals of an IC device built in a semiconductor wafer under test; interconnect parts at the front ends of which the contact parts are provided; a plurality of beam parts on the top surface of which the interconnect parts are provided along the longitudinal direction; and a base part supporting the plurality of beam parts all together in a cantilever fashion, the beam parts are supported by the base part at a rear end region of the beam parts, and grooves are provided between the adjoining beam parts in the rear end region.

6 Claims, 57 Drawing Sheets

Dicing

PROBE AND PROBE CARD

TECHNICAL FIELD

The present invention relates to a probe for contacting pads or electrodes or leads or other such input/output terminals provided at integrated circuits and other electrical circuits formed on a semiconductor wafer, a semiconductor chip, a semiconductor device package, a printed circuit board, etc. (hereinafter also referred to representatively as "IC devices") for establishing electrical contact with the IC devices when testing IC devices and to a probe card comprising the same.

BACKGROUND ART

A large number of semiconductor integrated circuit devices are built into a silicon wafer etc., then processed by dicing, bonding, packaging, and other steps to complete electronic devices. Such IC devices are subjected to operational tests before shipment. These tests are run in the wafer state or the state of the completed products.

At the time of testing an IC device in a wafer state, as the probe for establishing electrical connection with the IC device under test, one having a base part fixed on a board, beam parts with back end sides provided at the base part and with front end sides projecting from the base part, and conductive parts formed on the surface of the beam parts (hereinafter also simply referred to as a "silicon finger contactor") has been known in the past (for example, see Patent Citations 1 to 3).

This silicon finger contactor is formed from a silicon wafer using photolithography or another semiconductor production technology, so it becomes relatively easier to handle the reduction in size and pitch of input/output terminals accompanying the reduction in size of IC devices under test. However, IC devices are continuously being reduced in size, so further fineness of the silicon finger contactor is desired.

On the other hand, in order to secure stable contact between the probe and the input/output terminals of an IC device, it is necessary to press the probe against the input/output terminals by a predetermined load or more at the time of a test. For this reason, there is the problem that if increasing the fineness of the silicon finger contactor while securing a predetermined load or more at the time of pressing, the tensile stress occurring at the roots of the beam parts becomes larger.

[Patent Citation 1] Japanese Patent Publication (A) No. 2000-249722
[Patent Citation 2] Japanese Patent Publication (A) No. 2001-159642
[Patent Citation 3] WO 03/071289 pamphlet

DISCLOSURE OF THE INVENTION

Technical Problem

The problem which the present invention attempts to solve is to provide a probe and probe card which can reduce the tensile stress occurring at the roots of the beam parts.

Solution to Problem

To achieve the above object, according to a first aspect of the present invention, there is provided a probe for contacting input/output terminals of a device under test for establishing an electrical connection between the device under test and a test system when testing the device under test, characterized in that the probe comprises: conductive parts to be electrically connected with the input/output terminals of the device under test; a plurality of beam parts having one side main surfaces on which the conductive parts are provided; and a base part supporting the plurality of beam parts all together in a cantilever fashion, the beam parts are supported by the base part at a rear end region of the beam parts, and grooves are provided between the adjoining beam parts in the rear end region.

While the present invention is not particularly limited to this, preferably the groove opens toward a front end side and has a terminating end face between a frontmost end and a rearmost end in the rear end region.

While the present invention is not particularly limited to this, preferably, the adjoining beam parts are connected through flat surface in a portion between the terminating end face of the groove and the rearmost end of the rear end region.

While the present invention is not particularly limited to this, preferably a corner part between the terminating end face and a side face of the groove is formed in a tapered shape or a curved shape.

While the present invention is not particularly limited to this, preferably the conductive part has an interconnect part provided on the one side main surface of the beam part along a longitudinal direction and a contact part provided at front end of the interconnect part and contacting the input/output terminal of the device under test.

While the present invention is not particularly limited to this, preferably, the adjoining beam parts are connected through a flat surface and a pitch between the adjoining interconnect parts widen on the flat surface.

To achieve the above object, according to a second aspect of the present invention, there is provided a probe card characterized by comprising: the above-mentioned probe; and a board to which the base part of the probe is fixed.

Advantageous Effects of Invention

In the present invention, since grooves are provided between the beam parts adjoining each other in the rear end region, it is possible to reduce tensile stress occurring at the roots of beam parts when pressing against input/output terminals of a device under test compared with the case of no grooves.

EXPLANATION OF REFERENCES

Figure 1:
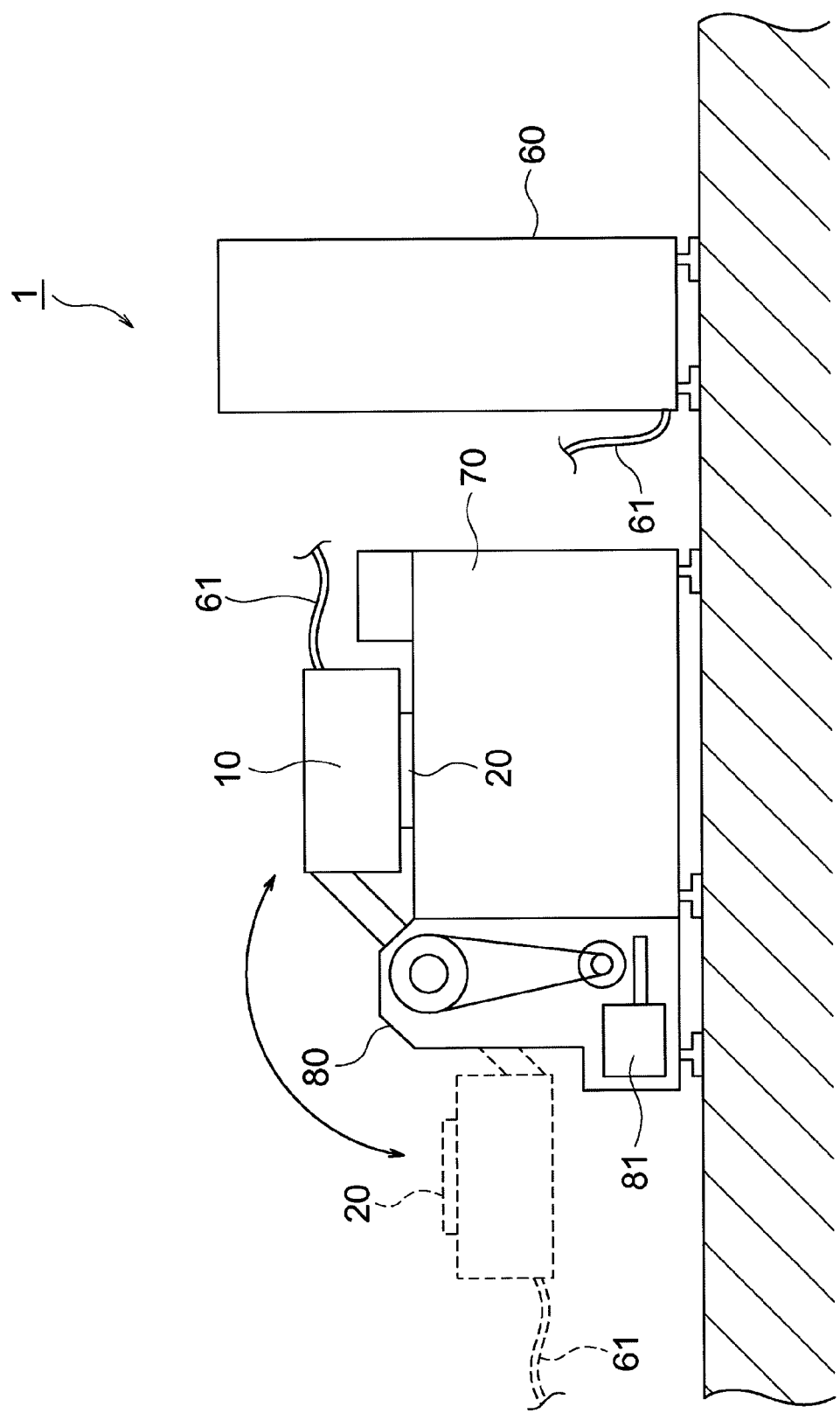
FIG. 1 is a schematic view showing an electronic device test system in a first embodiment of the present invention.

1 . . . electronic device test system
10 . . . test head
20 . . . interface section
30 . . . probe card
31 . . . probe board
40 . . . probe
41 . . . base part 42 . . . beam part
422 . . . rear end region
43A to 43C . . . grooves
44 . . . interconnect part
45 . . . contact part
100 . . . semiconductor wafer under test
110 . . . input/output terminals

BEST MODE FOR CARRYING OUT THE
INVENTION

Below, embodiments of the present invention will be explained based on the drawings.

Figure 2:
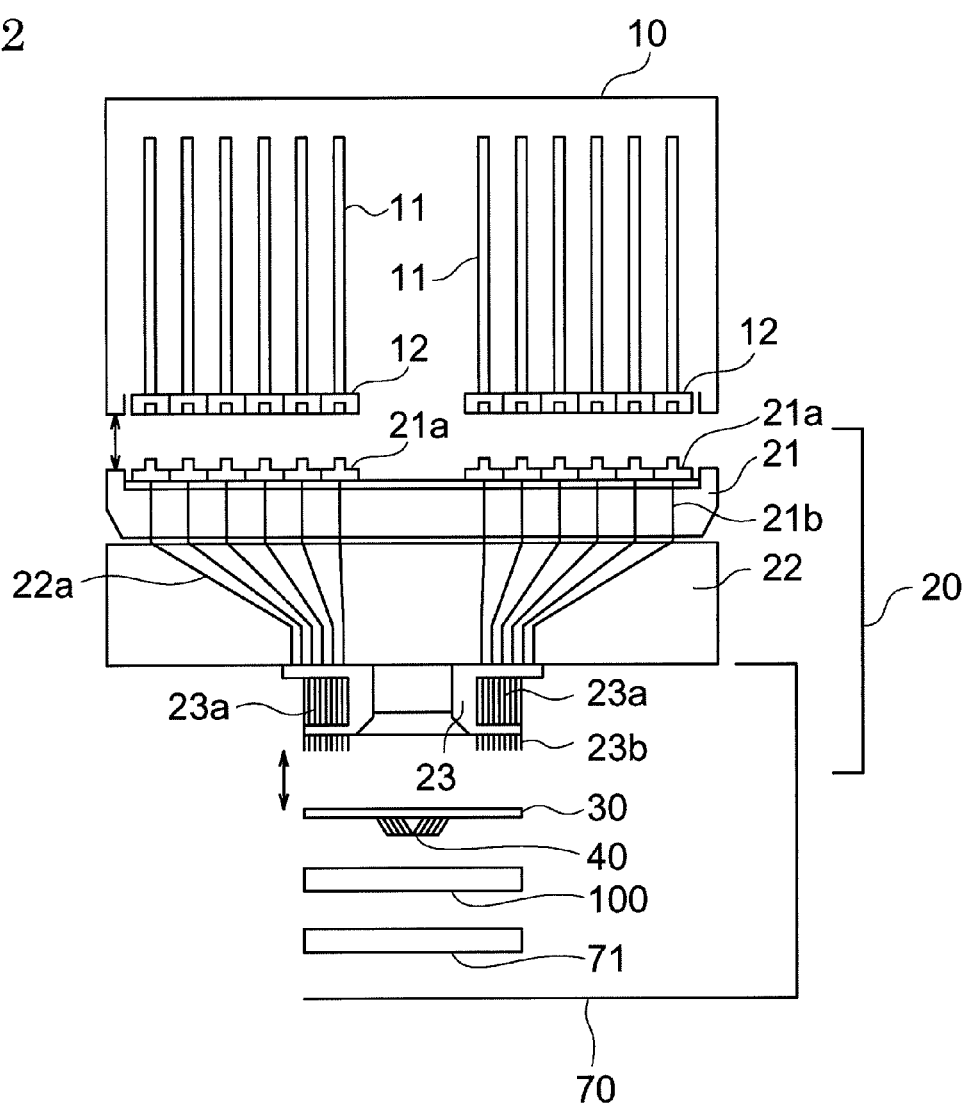
FIG. 2 is a schematic view showing the connection relationship among a test head, probe card, and prober in the first embodiment of the present invention.

FIG. 1 is a schematic view showing an electronic device test system of a first embodiment of the present invention, while FIG. 2 is a conceptual view showing the connection relationships of a test head, probe card, and prober in a first embodiment of the present invention.

The electronic device test system 1 in the first embodiment of the present invention, as shown in FIG. 1, comprises a test head 10, a tester 60, and a prober 70. The tester 60 is electrically connected through a cable bundle 61 to the test head 10 and can input and output test signals with IC devices built into a silicon wafer 100 under test. The test head 10 is arranged above the prober 70 by a manipulator 80 and a drive motor 81.

As shown in FIG. 1 and FIG. 2, a large number of pin electronics 11 are provided inside the test head 10. These pin electronics 11 are connected through the cable bundle 61 having several hundred internal cables to the tester 60. Further, the pin electronics 11 are electrically connected to connectors 12 for connection with a mother board 21 and therefore can be electrically connected with contact terminals 21a on the mother board 21 of the interface section 20.

The test head 10 and the prober 70 are connected through the interface section 20. This interface section 20 comprises the mother board 21, a wafer performance board 22, and a frog ring 23. The mother board 21 is provided with the contact terminals 21a for electrical connection with the connectors 12 on the test head 10 side. Interconnect patterns 21b are formed for electrically connecting the contact terminals 21a and the wafer performance board 22. The wafer performance board 22 is electrically connected through pogo pins etc. to the mother board 21. Interconnect patterns 22a are formed so as to convert the pitch of the interconnect patterns 21b on the mother board 21 to the frog ring 23 side pitch in order to electrically connect the interconnect patterns 21b to a flexible board 23a provided in the frog ring 23.

The frog ring 23 is provided on the wafer performance board 22. To allow some alignment between the test head 10 and the prober 70, an internal transmission path is formed by the flexible board 23a. A large number of pogo pins 23b to which this flexible board 23a is electrically connected are mounted at the bottom surface of the frog ring 23.

The probe card 30 on the bottom surface of which a large number of probes 40 are mounted is electrically connected through the pogo pins 23b to the frog ring 23. While not particularly illustrated, the probe card 30 is fixed through a holder to a top plate of the prober 70. The probes 40 approach the inside of the probe 70 through an opening in the top plate.

The prober 70 can hold a wafer under test 100 on a chuck 71 by suction etc. and automatically supply that wafer 100 to a position facing the probe card 30.

In the above such configuration of an electronic device test system 1, the wafer under test 100 held on the chuck 71 is pushed by the prober 70 against the probe card 30 to make the probes 40 electrically contact the input/output terminals 110 of an IC device built in the wafer under test 100. In that state, the tester 60 sends the IC device a DC signal and a digital signal and receives an output signal from the IC device. The output signal (response signal) from this IC device is compared with the expected values by the tester 60 to evaluate the electrical characteristics of the IC device.

Figure 3:
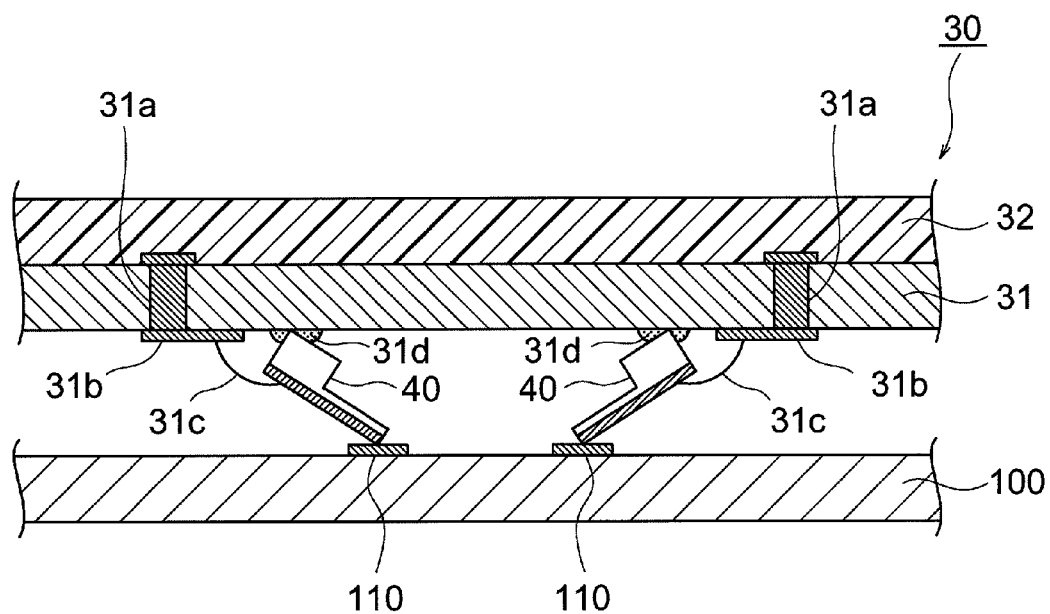
FIG. 3 is a schematic cross-sectional view of the probe card in the first embodiment of the present invention.
Figure 4:
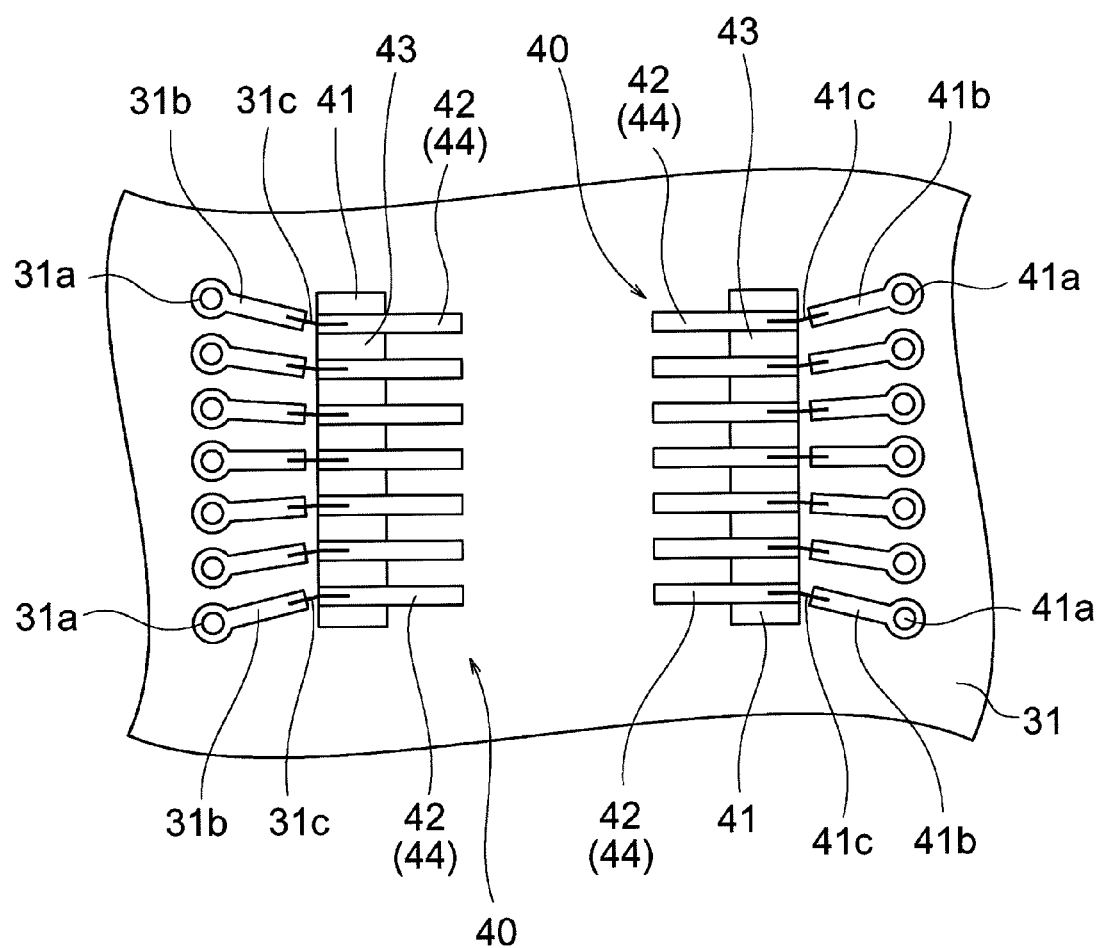
FIG. 4 is a partial plan view of the probe card seen from the bottom in the first embodiment of the present invention.
Figure 5:
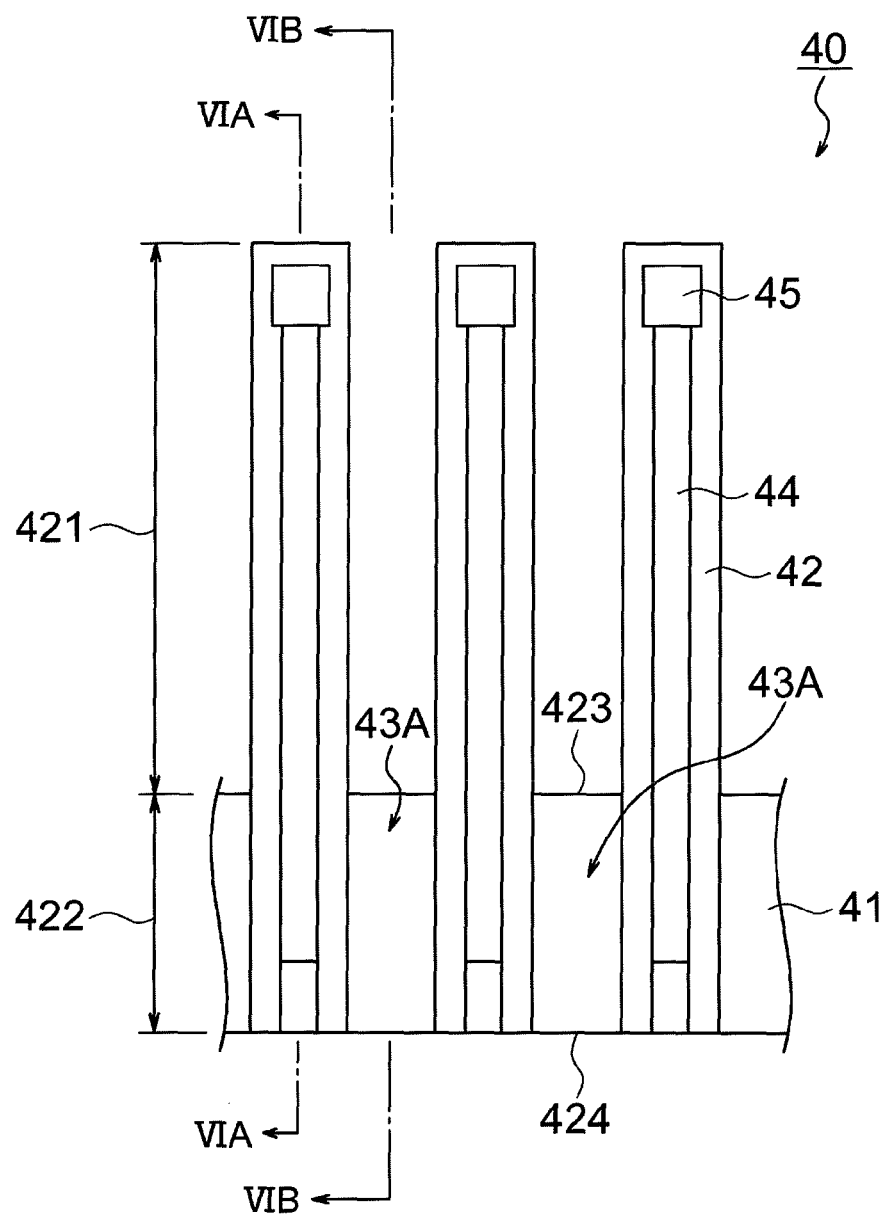
FIG. 5 is a partial plan view of a probe in the first embodiment of the present invention.
Figure 6A:
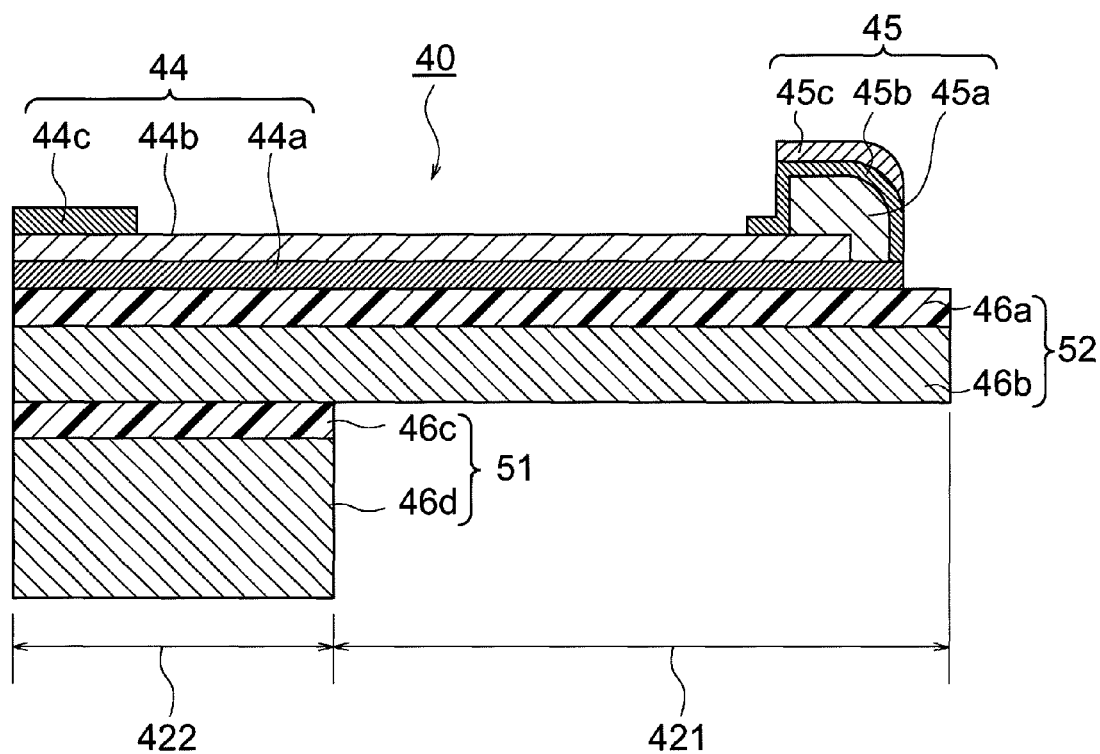
FIG. 6A is a cross-sectional view along the line VIA-VIA of FIG. 5.
Figure 6B:
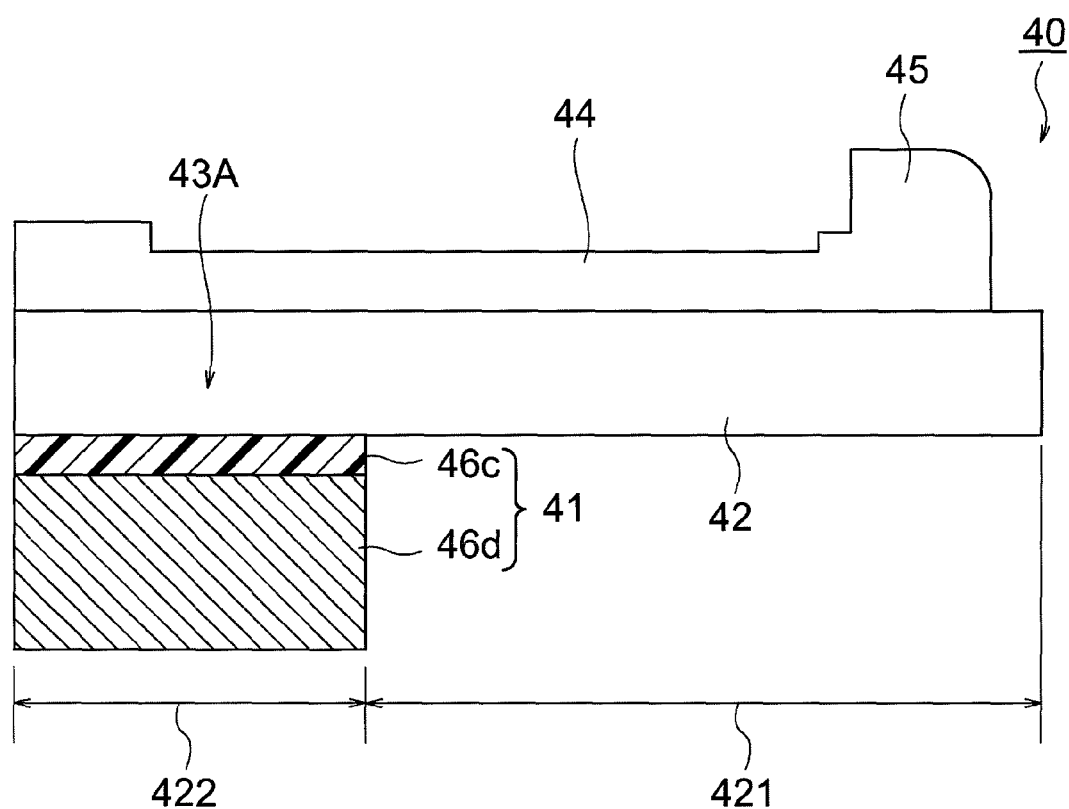
FIG. 6B is a cross-sectional view along the line VIB-VIB of FIG. 5.

FIG. 3 is a schematic cross-sectional view of a probe card in a first embodiment of the present invention, FIG. 4 is a partial plan view of a probe card in a first embodiment of the present invention seen from the bottom side, FIG. 5 is a partial plan view of a probe in a first embodiment of the present invention, FIG. 6A is a cross-sectional view along the line VIA-VIA of FIG. 5, and FIG. 6B is a cross-sectional view along the line VIB-VIB of FIG. 5.

The probe card 30 in the embodiment, as shown in FIG. 3 and FIG. 4, comprises: a probe board 31 comprising for example a multilayer circuit board etc.; a stiffener 32 attached to a top surface of the probe board 31 for reinforcing the mechanical strength; and a large number of silicon finger contactors 40 mounted on the bottom surface of the probe board 31.

The probe board 31 is formed with through holes 31a so as to pass from the bottom surface to the top surface. Connection traces 31b connected to the through holes 31a are formed on the bottom surface.

The silicon finger contactors (probes) 40 in the present embodiment are probes for contacting the input/output terminals 110 of an IC device for establishing electrical connection between the IC device and the test head 10. Each probe 40, as shown in FIG. 5 to FIG. 6B, comprises: a base part 41 fixed to a probe board 31; columnar beam parts 42 supported at back end sides by the base part 41 and with front end sides sticking out from the base part 41; interconnect parts 44 formed on the top surfaces of the beam parts 42; and contact parts 45 formed at front ends of the interconnect parts 44.

Note that, in the present embodiment, the "back end side" in each probe 40 indicates the side fixed to the probe board 31 (left side in FIG. 6A). As opposed to this, the "front end side" in the probe 40 indicates the side contacting the input/output terminals 110 of the semiconductor wafer under test 100 (right side in FIG. 6A). Further, a region of the beam parts 42 sticking out from the base part 41 toward the front end side is called a projecting region 421, while a region of the beam parts 42 supported by the base part 41 is called a rear end region 422.

The base part 41 and beam parts 42 of each probe 40 are produced by applying photolithography or other semiconductor production technology to the silicon wafer 46. As shown in FIG. 5 to FIG. 6B, a single base part 41 supports a plurality of beam parts 42 together at the rear end region 422 in a cantilever fashion. That plurality of beam parts 42 stick out from the base part 41 along directions substantially parallel to each other in a finger shape (comb shape).

The base part 41, as shown in FIG. 6A, comprises: a support layer 46d made of silicon; and a BOX layer 46c formed on this support layer 46d and made of silicon oxide ($SiO_2$). On the other hand, each beam part 42 comprises: an active layer 46b made of silicon (Si); and a first $SiO_2$ layer 46a formed on that active layer 46b and functioning as an insulating layer.

Further, in the present embodiment, as shown in FIG. 5 to FIG. 6B, grooves 43A are provided between adjoining beam parts 42 in the rear end region 421 of the plurality of beam parts 42. As will be understood if comparing FIG. 6A and FIG. 6B, each groove 43A has a depth corresponding to the thicknesses of the first $SiO_2$ layer 46a and active layer 46b and has a width substantially the same as the width between the projecting region 421 of the beam parts 42. Further, each groove 43A opens at the frontmost end 423 of the rear end region 422 and also opens at the rearmost end 424 of that region 422.

By providing such grooves 43A at the rear end region 422 of the beam parts 42, when a probe 40 presses against input/output terminals 110 of the semiconductor wafer under test 100, the region of the probe 40 where stress concentrates is expanded to the back end side and dispersed, so the tensile stress occurring at the roots of the beam parts 42 can be reduced. Due to this, the allowable value of the amount of deformation forming the breakage limit of the probe 40 becomes larger and the fatigue resistance characteristics of the probe 40 are also improved.

Figure 7:
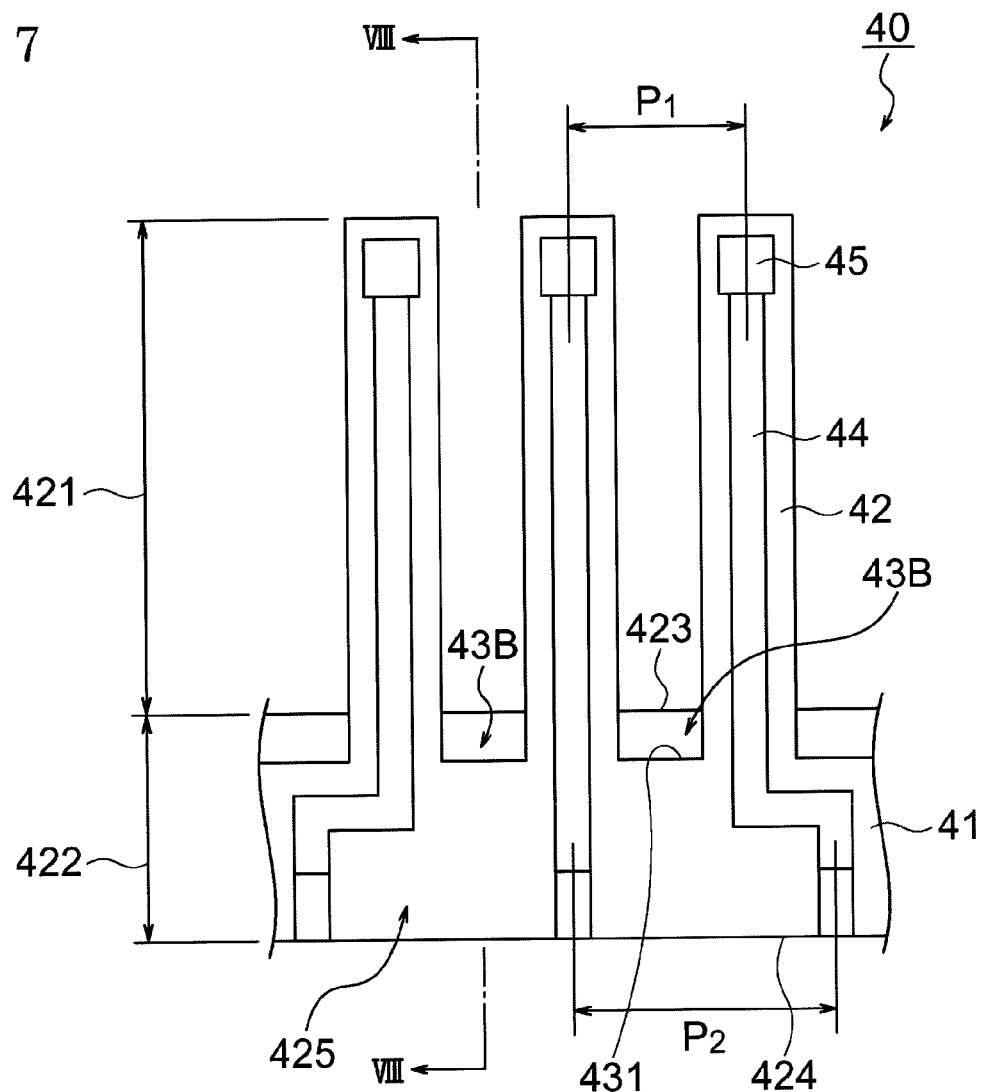
FIG. 7 is a partial plan view of a probe in a second embodiment of the present invention.

Note that, the grooves may also be formed so as to stop midway at the rear end region 422. FIG. 7 is a partial plan view of a probe in a second embodiment of the present invention, FIG. 8 is a cross-sectional view along the line VIII-VIII of FIG. 7, and FIG. 9 is a partial plan view of a probe in a third embodiment of the present invention.

Figure 8:
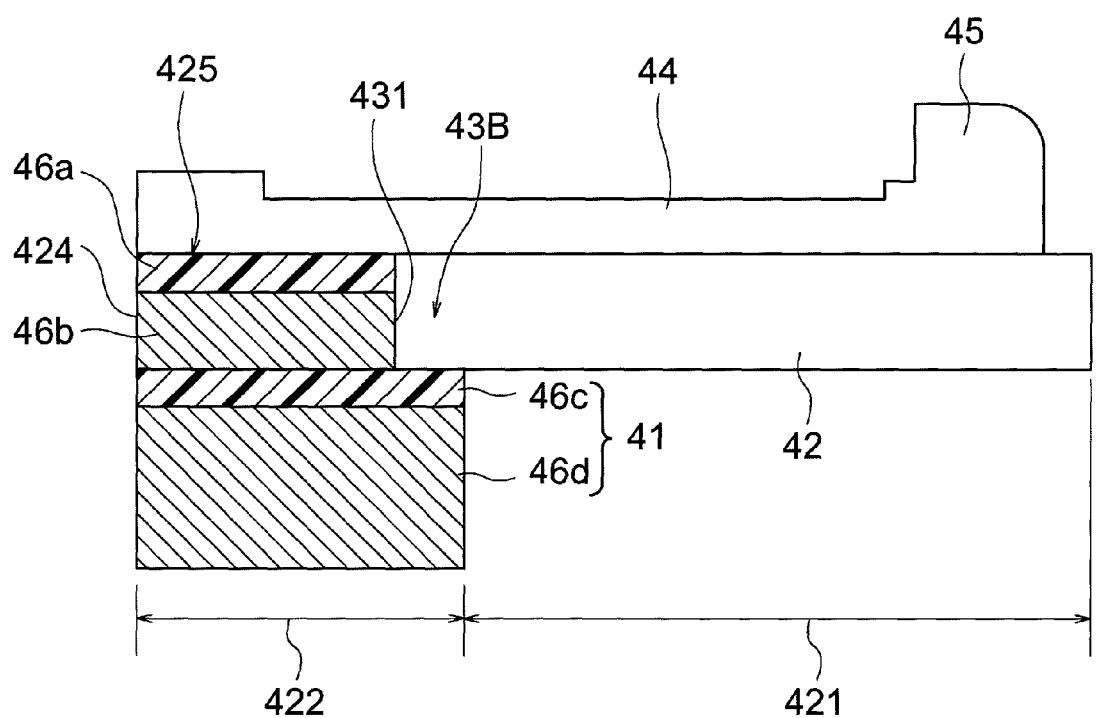
FIG. 8 is a cross-sectional view along the line VIII-VIII of FIG. 7.

The groove 43B in the second embodiment of the present invention, as shown in FIG. 7 and FIG. 8, is similar to the first embodiment in the point of opening at the frontmost end 423 of the rear end region 422, but differs from the first embodiment in the point that the terminating end wall 431 is positioned between the frontmost end 423 and rearmost end 424 of the rear end region 422.

In the present embodiment, as shown in the figure, the adjoining beam parts 42 are connected through a flat surface in a portion between the terminating end wall 431 of the groove 43B and the rearmost end 424 of the rear end region 422. The pitch between adjoining interconnect parts 44 widens on that flat surface 425 ($P_1 < P_2$). Due to this, it is possible to achieve both a reduction in the tensile stress and flexibility of layout of interconnects.

Figure 9:
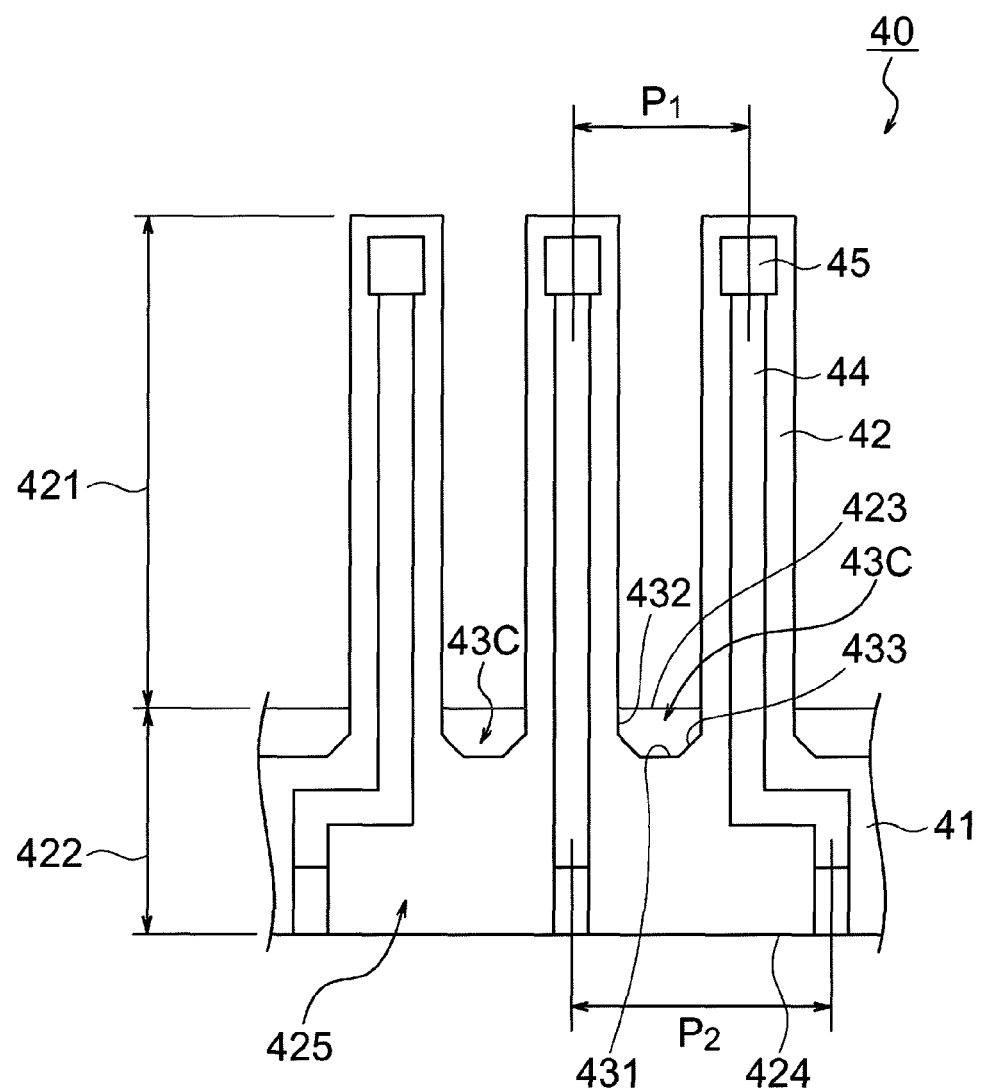
FIG. 9 is a partial plan view of a probe in a third embodiment of the present invention.

Further, the groove 43C in the third embodiment of the present invention, as shown in FIG. 9, differs from the second embodiment in the point that the corner part 433 between the terminating end wall 431 and the side wall 432 of the groove 43C is formed in a tapered shape. By making the corner part 433 a tapered shape, it is possible to achieve a further reduction in the tensile stress. Note that, in the present invention, it is also possible to form the corner part 433 into a curved shape.

Returning to FIG. 6A, an interconnect part 44 is provided on the insulating layer (the first $SiO_2$ layer) 46a. The interconnect part 44, as shown in the figure, comprises: a seed layer (power feed layer) 44a made of titanium and gold; a first interconnect layer 44b provided on the seed layer 44a and made of gold; and a second interconnect layer 44c provided at a back end of the first interconnect layer 44b and made of high purity gold. Note that, the first interconnect layer 44b has a 5 to 10 μm thickness. If the thickness of the first interconnect layer 44b is less than 5 μm, heat is liable to be generated. While if it is more than 10 μm, warping is liable to occur.

The front end part of the first interconnect layer 44b is formed with a contact part 45, so the first interconnect layer 44b is required to have a relatively high mechanical strength. For this reason, as the material forming the first interconnect layer 44b, 99.9% or higher purity gold to which nickel, cobalt, or another different type of metal material is added in an amount of less than 0.1% is used. The Vicker's hardness of the first interconnect layer 44b rises to Hv 130 to 200. As opposed to this, the second interconnect layer 44c can be bonded at a later step and is given a high conductivity by being made of a purity 99.999% or higher gold.

The contact part 45 is provided at the front end of the interconnect part 44 so as to project out upward. This contact part 45 comprises: a first contact layer 45a formed on a step consisiting of the seed layer 44a and the first interconnect layer 44b; a second contact layer 45b provided so as to envelop the first contact layer 45a and made of gold; and a third contact layer 45c provided so as to envelop the second contact layer 45b. As the material for forming the first contact layer 45a, nickel or nickel cobalt or another nickel alloy may be mentioned. Further, as the material for forming the third contact layer 45c, rhodium, platinum, ruthenium, palladium, iridium, or their alloys or other conductive materials having a high hardness and superior in corrosion resistance may be mentioned. By providing such a contact part 45 at the front end of the interconnect part 44, it is possible to eliminate direct contact of the relatively deformable first interconnect layer 44b with the input/output terminals 110 of the IC device.

The above such configuration of a probe 40, as shown in FIG. 3, is mounted on the probe board 31 so as to face the input/output terminal 110 of an IC device under test built in the semiconductor wafer 100. Note that, FIG. 3 shows only two probes 30, however in actuality several hundred to several thousand probes 40 are mounted on the probe board 31.

Each probe 40, as shown in FIG. 3, is fixed to the probe board 31 using a binder 31d in the state with an edge part of the base part 41 made to abut against the probe board 31. As this binder 31d, for example, a UV ray curing type binder, a temperature curing type binder, a thermoplastic binder, etc. may be mentioned.

Further a bonding wire 31c connected to a connection trace 31b is connected to the second interconnect layer 44c of the interconnect part 44. The interconnect part 44 of the probe 40 and the connection trace 31b of the probe board 31 are electrically connected via this bonding wire 31c. Note that, instead of the bonding wire 31c, solder balls may also be used to electrically connect the interconnect part 44 and connection trace 31b.

Such a configuration of a probe card 30 is used to test an IC device by using the prober 70 to press a wafer under test 100 against the probe card 30 so that the probes 40 on the probe board 31 and the input/output terminals 110 of the wafer under test 100 electrically contact each other and, in that state, having the tester input and output test signals with the IC devices.

Below, an example of a method of production of a probe in a first embodiment of the present invention will be explained with reference to FIG. 10 to FIG. 43. FIG. 10 to FIG. 43 are cross-sectional views or plan views of an SOI wafer at the different steps of the method of production of a probe according to the first embodiment of the present invention.

Figure 10:
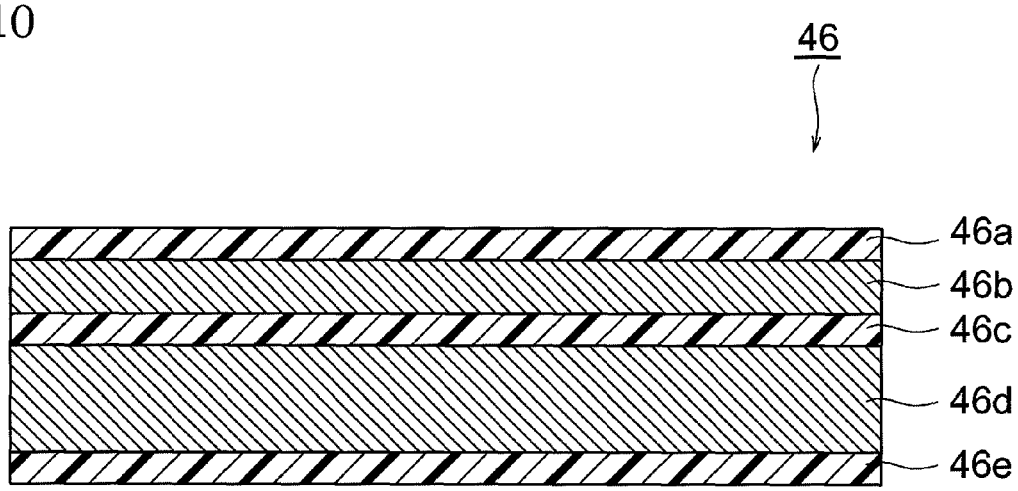
FIG. 10 is a cross-sectional view of an SOI wafer at a first step of a method of production of a probe according to the first embodiment of the present invention.

First, in the method of production in the present embodiment, at a first step shown in FIG. 10, an SOI wafer (silicon on insulator wafer) 46 is prepared. This SOI wafer 46 is a silicon wafer comprising three $SiO_2$ layers 46a, 46c, and 46e among which two Si layers 46b, 46d are sandwiched. The $SiO_2$ layers 46a, 46c, and 46e of this SOI wafer 46 function as etching stoppers when producing the probes 40 and function as insulating layers.

Here, to make the high frequency characteristics of the probes 40 better, the first $SiO_2$, layer 46a has a 1 μm or higher layer thickness, while the active layer 46b has a 1 kΩ·cm or higher volume resistivity. Further the tolerance of the layer thickness of the active layer 46b is ±3 μm or less and the tolerance of the layer thickness of the support layer 46d is ±1 μm or less so that the beam parts 42 have stable spring characteristics.

Figure 11A:
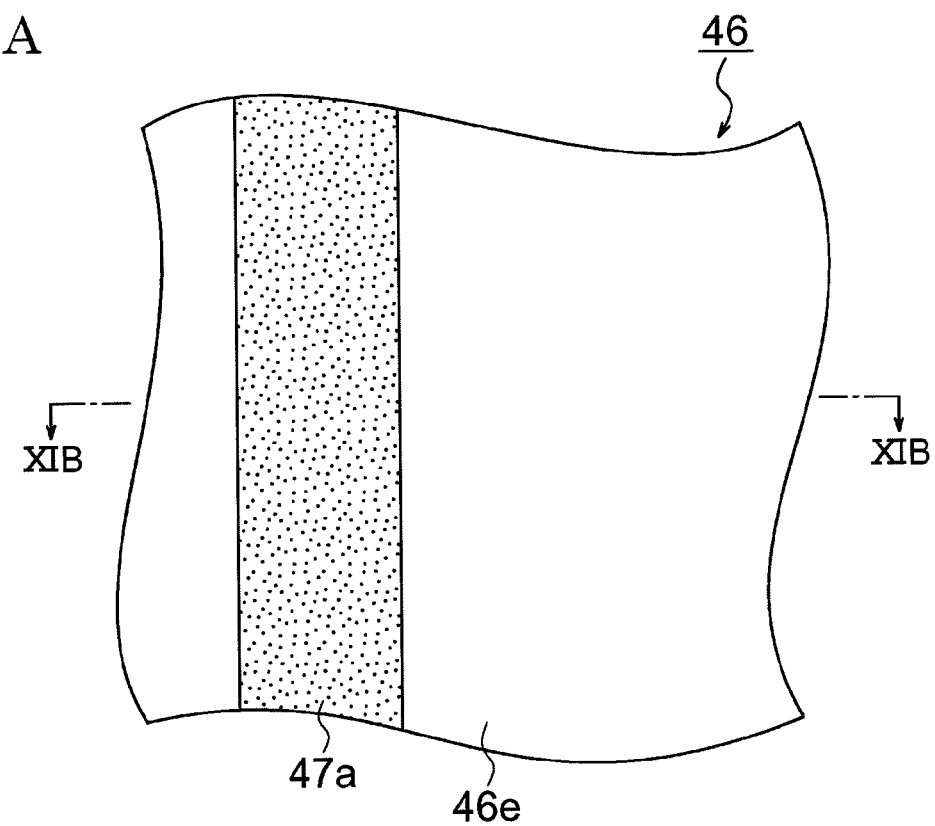
FIG. 11A is a plan view seen from the bottom of an SOI wafer at a second step of the method of production of a probe according to the first embodiment of the present invention.
Figure 11B:
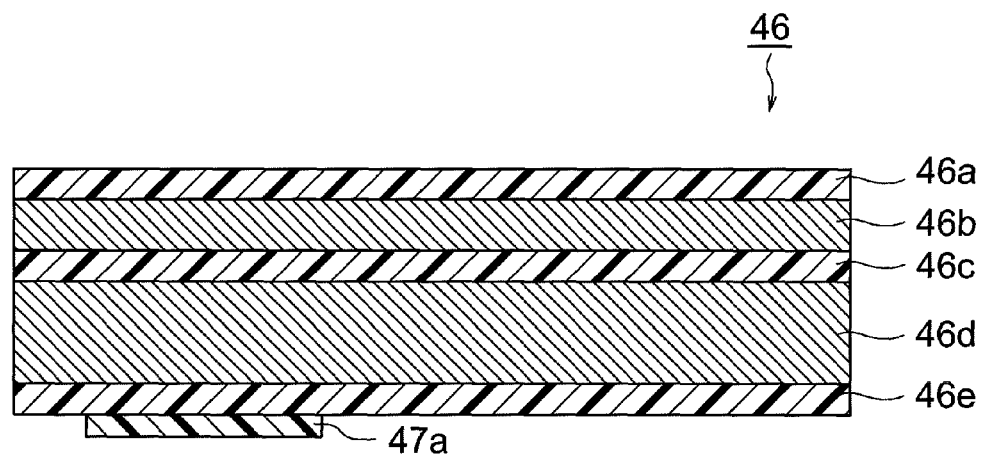
FIG. 11B is a cross-sectional view along the line XIB-XIB of FIG. 11A.

Next, at a second step shown in FIG. 11A and FIG. 11B, a first resist layer 47a is formed on the bottom surface of the SOI wafer 46. At this step, while not particularly illustrated, first a photoresist film is formed on the second SiO₂ 46e, then this photoresist film is overlaid with a photomask and exposed by UV rays to cure (solidify) it in that state so as to form the first resist layer 47a on a part of the second SiO₂ layer 46e. Note that the parts of the photoresist film not exposed by the UV rays are then dissolved and washed away from the second SiO₂ layer 46e. This first resist layer 47a functions as an etching mask pattern at the next third step.

Figure 12:
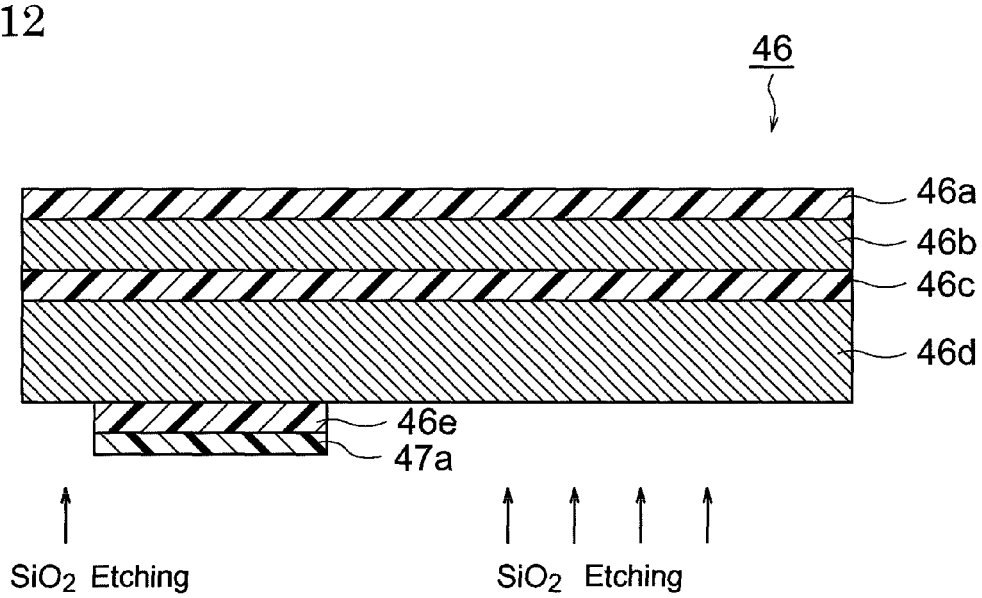
FIG. 12 is a cross-sectional view of an SOI wafer at a third step of the method of production of a probe according to the first embodiment of the present invention.

Next, at a third step shown in FIG. 12, for example RIE (reactive ion etching) etc. is used for etching the second SiO₂ layer 46e from the bottom of the SOI wafer 46. Due to this etching, the parts of the second SiO₂ layer 46e not protected by the first resist layer 47a are eaten away.

Figure 13:
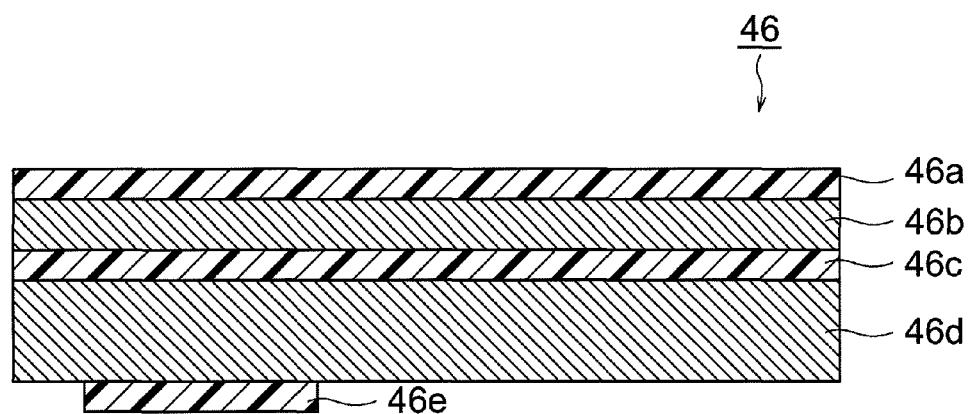
FIG. 13 is a cross-sectional view of an SOI wafer at a fourth step of the method of production of a probe according to the first embodiment of the present invention.

After this etching is completed, at a fourth step shown in FIG. 13, the first resist layer 47a remaining on the second SiO₂ layer 46e is removed (resist peeling). In this resist peeling, oxygen plasma is used for ashing the resist, then for example hydrogen persulfide or another washing solution is used to wash the SOI wafer 46. The second SiO₂ layer 46e remaining at the bottom of the SOI wafer 46 functions as a mask material in the etching at a 29th step explained in FIG. 38.

Figure 14A:
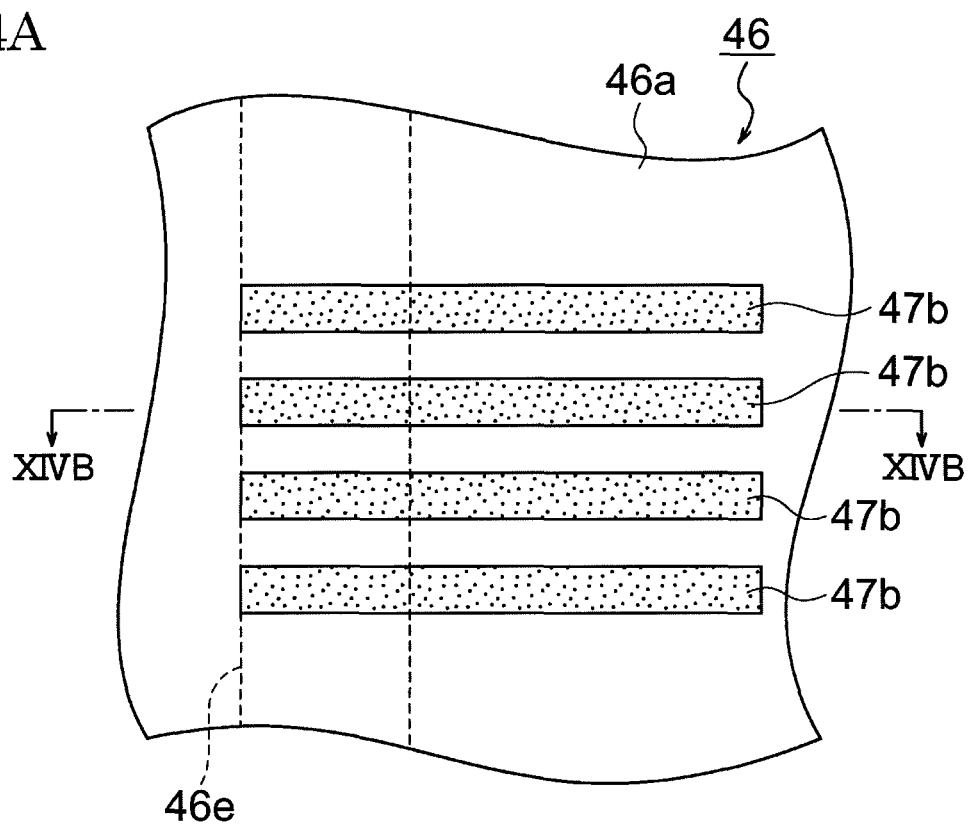
FIG. 14A is a plan view seen from the top of an SOI wafer at a fifth step of the method of production of a probe according to the first embodiment of the present invention.
Figure 14B:
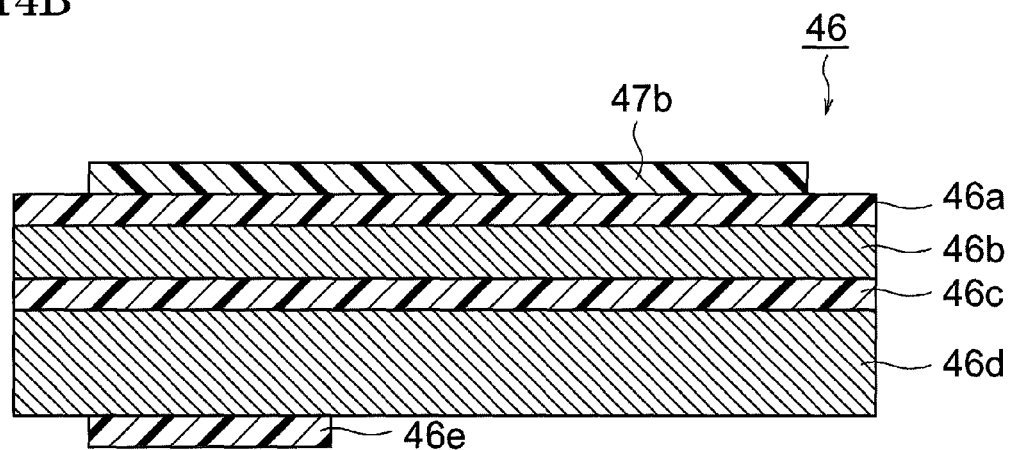
FIG. 14B is a cross-sectional view along the line XIVB-XIVB of FIG. 14A.

Next, at a fifth step shown in FIG. 14A and FIG. 14B, a second resist layer 47b is formed on the surface of the first SiO₂ layer 46a. As shown in FIG. 14A, this second resist layer 47b is formed in a plurality of strip shapes on the top surface of the SOI wafer 46 by a similar procedure as the first resist layer 47a explained at the second step.

Figure 15:
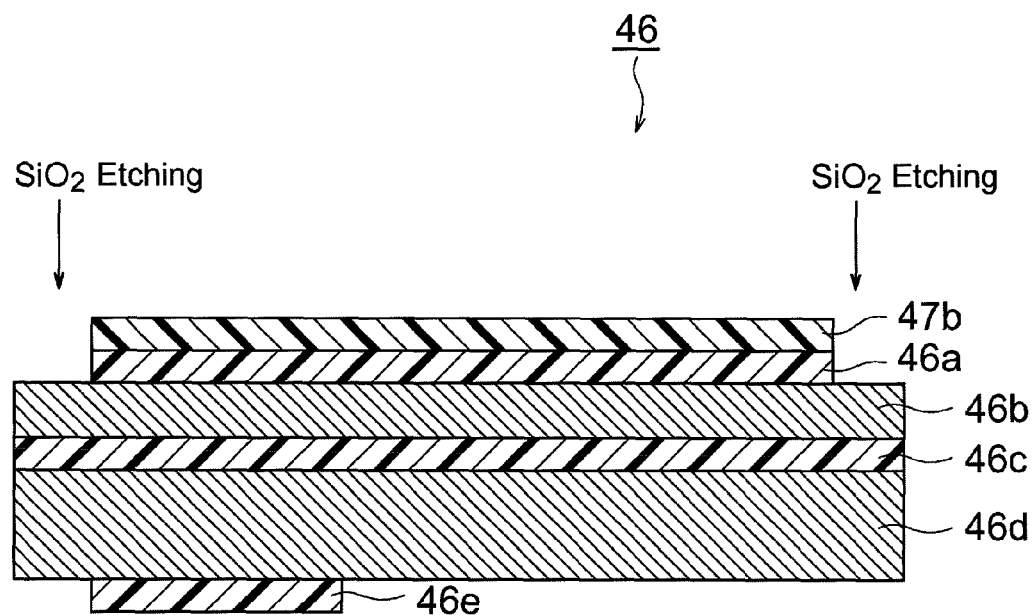
FIG. 15 is a cross-sectional view of an SOI wafer at a sixth step of the method of production of a probe according to the first embodiment of the present invention.

Next, at a sixth step shown in FIG. 15, for example RIE etc. is used to etch the first SiO₂ layer 46a from above the SOI wafer 46. Due to this etching, the parts of the first SiO₂ layer 46a not protected by the second resist layer 47b are eaten away and the first SiO₂ layer 46 becomes a plurality of strip shapes (see FIG. 16A).

Figure 16A:
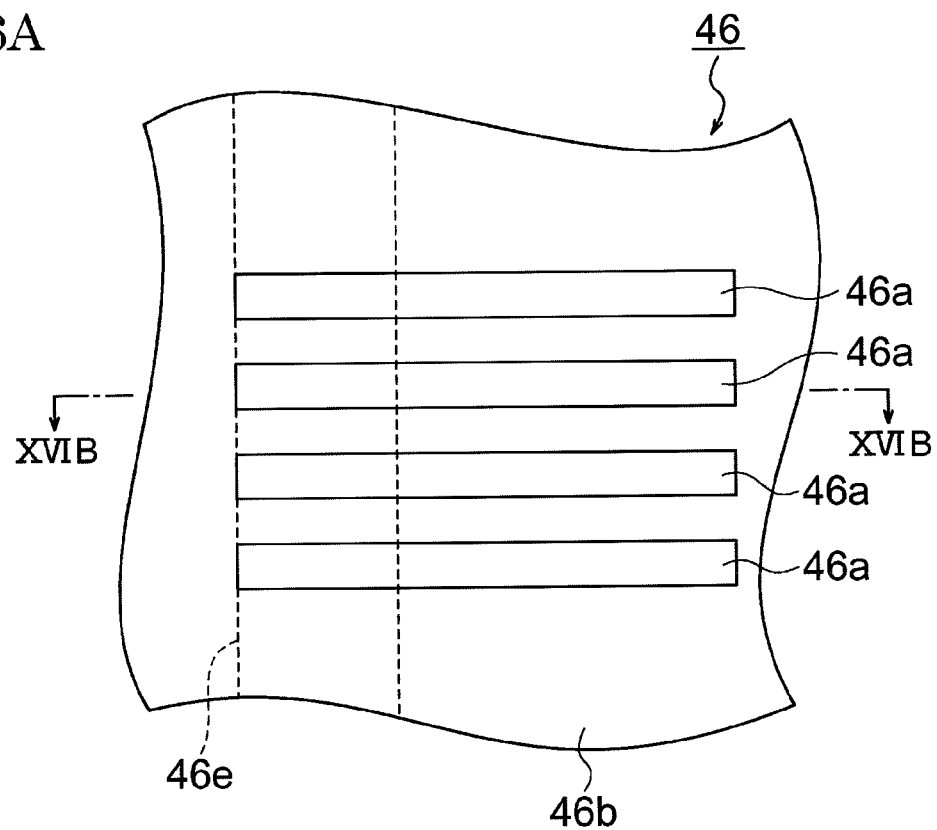
FIG. 16A is a plan view seen from the top of an SOI wafer at a seventh step of the method of production of a probe according to the first embodiment of the present invention.
Figure 16B:
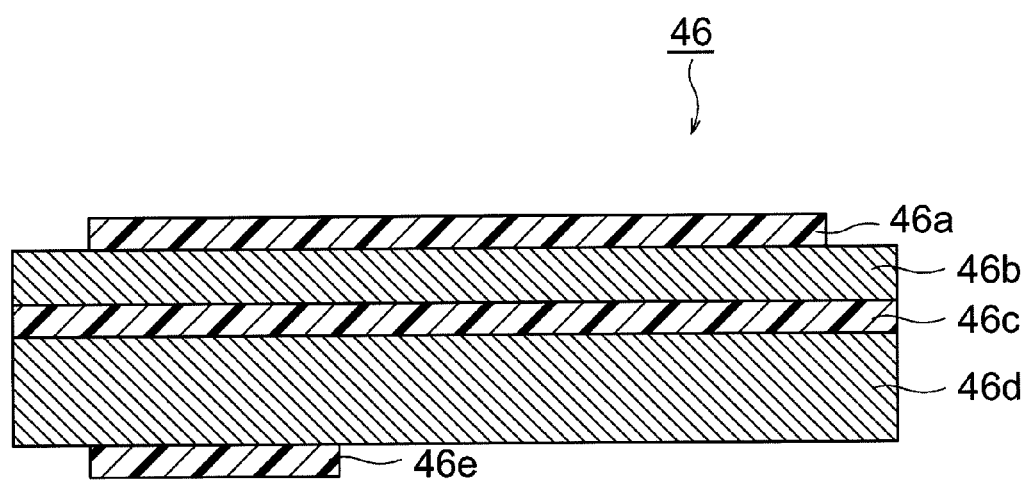
FIG. 16B is a cross-sectional view along the line XVIB-XVIB of FIG. 16A.
Figure 17:
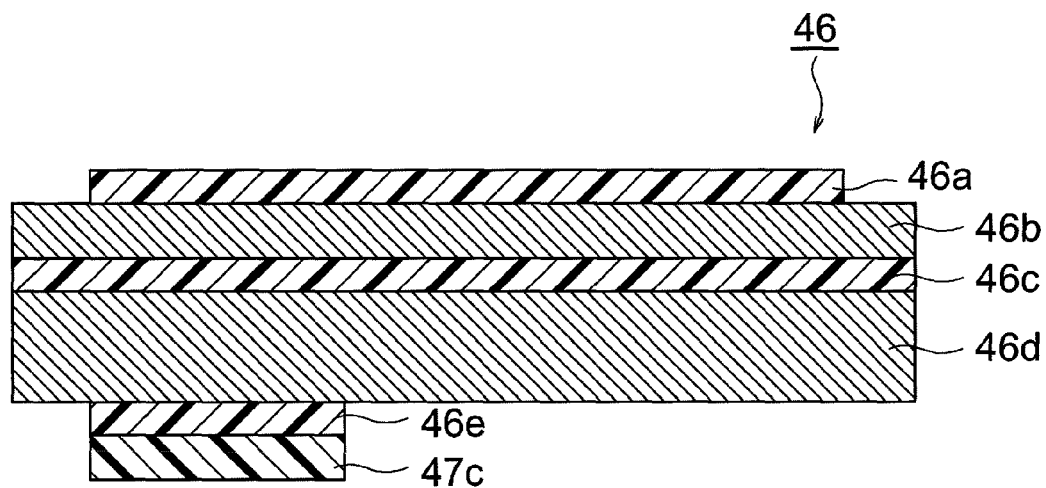
FIG. 17 is a cross-sectional view of an SOI wafer at an eighth step of the method of production of a probe according to the first embodiment of the present invention.

Next, at a seventh step shown in FIG. 16A and FIG. 16B, a similar procedure as with the above-mentioned fourth step is used to remove the second resist layer 47b. At an eighth step shown in FIG. 17, a similar procedure as with the above-mentioned second step is used to form a third resist layer 47c on the second SiO₂ layer 46e.

Figure 18:
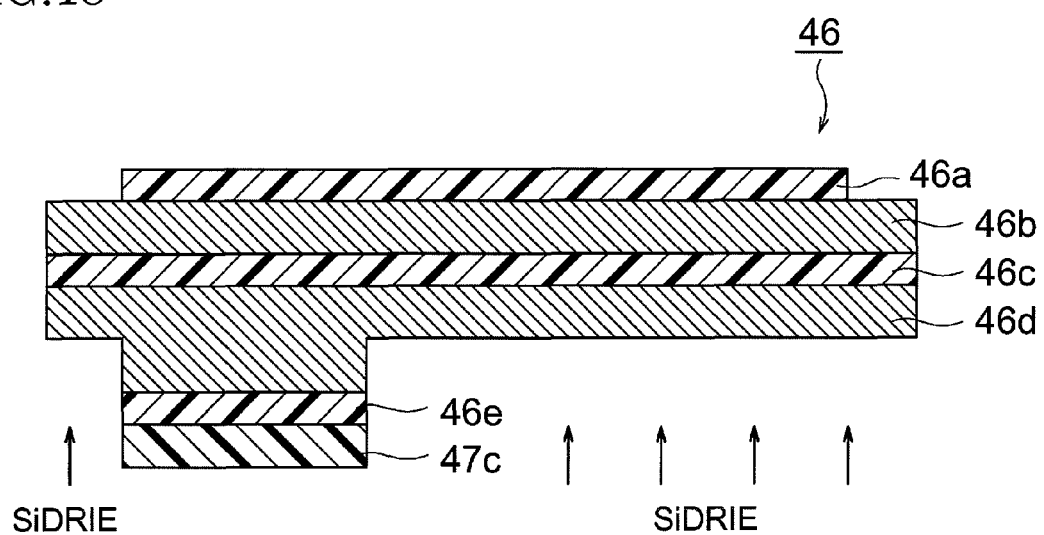
FIG. 18 is a cross-sectional view of an SOI wafer at a ninth step of the method of production of a probe according to the first embodiment of the present invention.
Figure 19:
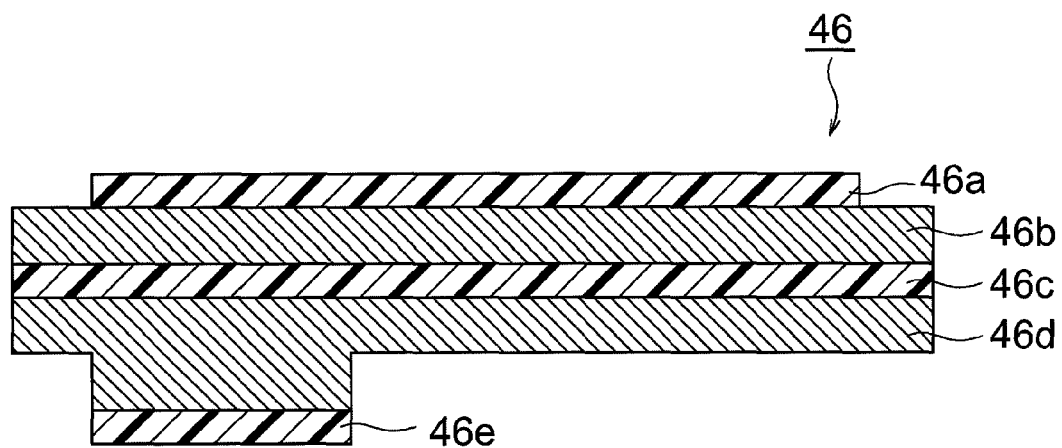
FIG. 19 is a cross-sectional view of an SOI wafer at a 10th step of the method of production of a probe according to the first embodiment of the present invention.

Next, at a ninth step shown in FIG. 18, the support layer 46d is etched from the bottom of the SOI wafer 46. As the specific technique for this etching, for example, a DRIE (deep reactive ion etching) method etc. can be used. By this etching, the parts of the support layer 46d not protected by the third resist layer 47c are eaten away to a depth of about half of the support layer 46d. Next, at a 10th step shown in FIG. 19, a similar procedure as the above-mentioned fourth step is used to remove the third resist layer 47c.

Figure 20:
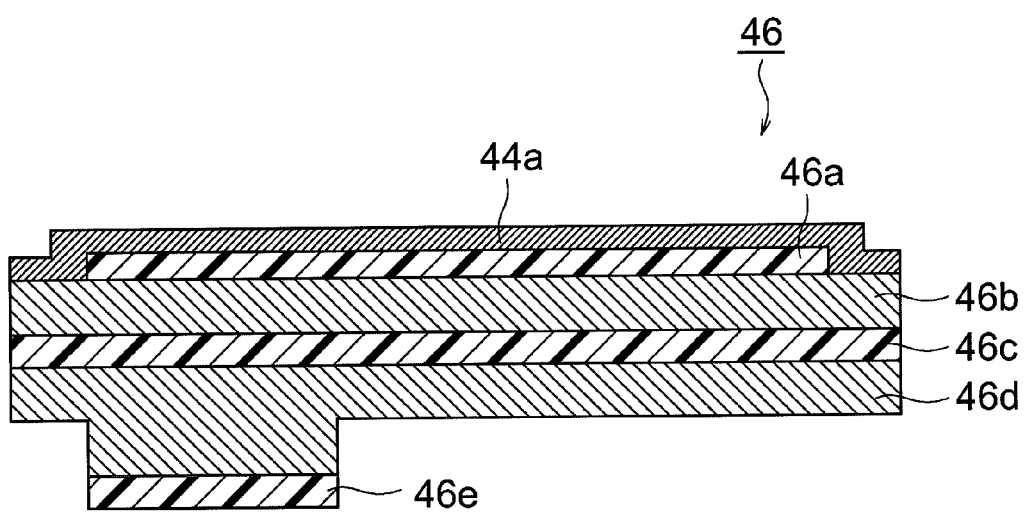
FIG. 20 is a cross-sectional view of an SOI wafer at an 11th step of the method of production of a probe according to the first embodiment of the present invention.

Next, at an 11th step shown in FIG. 20, a seed layer 44a made of titanium and gold is formed on the entire top surface of the SOI wafer 46. As the specific technique for forming the seed layer 44a, for example, vacuum deposition, sputtering, vapor phase deposition, etc. may be mentioned. This seed layer 44a functions as a power feed layer when forming a later mentioned first interconnect layer 44b.

Figure 21A:
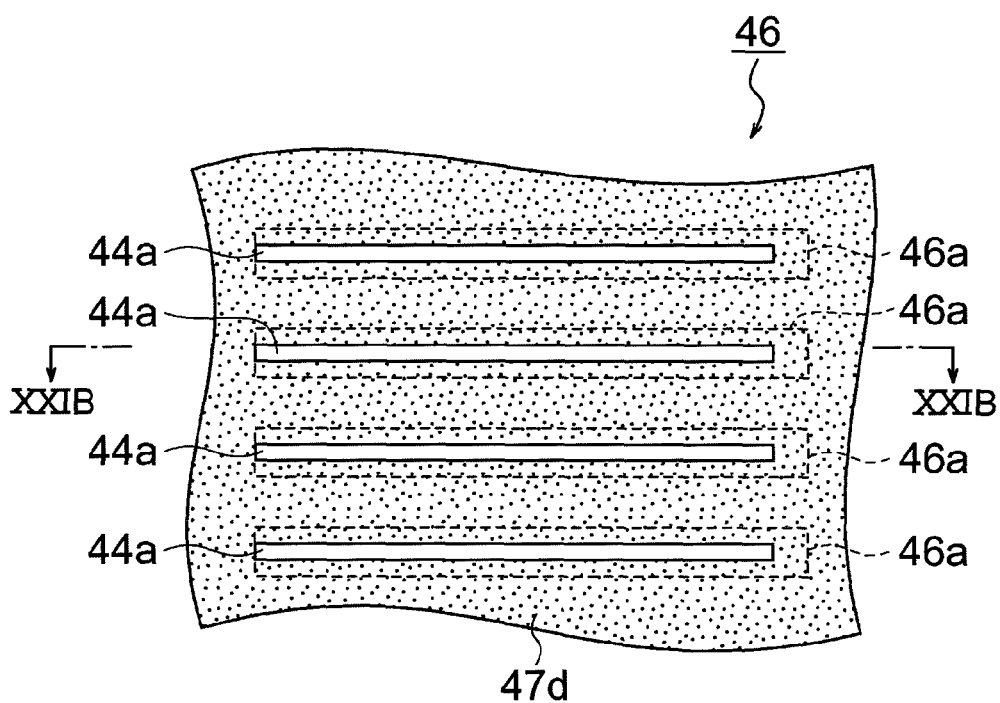
FIG. 21A is a plan view seen from the top of an SOI wafer at a 12th step of the method of production of a probe according to the first embodiment of the present invention.
Figure 21B:
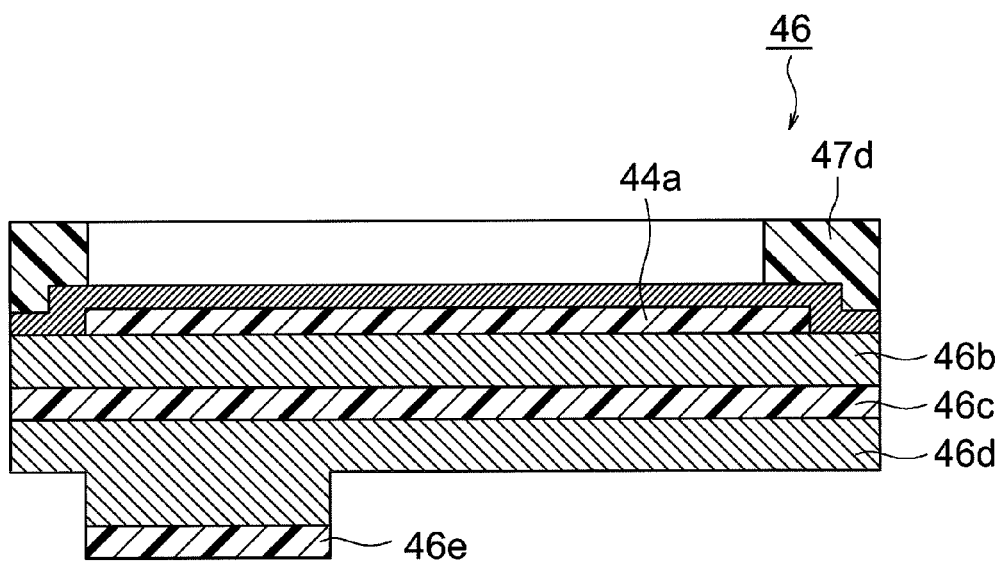
FIG. 21B is a cross-sectional view along the line XXIB-XXIB of FIG. 21A.

Next, at a 12th step shown in FIG. 21A and FIG. 21B, a similar procedure as in the above-mentioned second step is used to form a fourth resist layer 47d on the surface of the seed layer 44a. This fourth resist layer 47d, as shown in FIG. 21A, is formed on the whole of the seed layer 44a except for the parts where interconnect parts 44 are to be finally formed.

Figure 22:
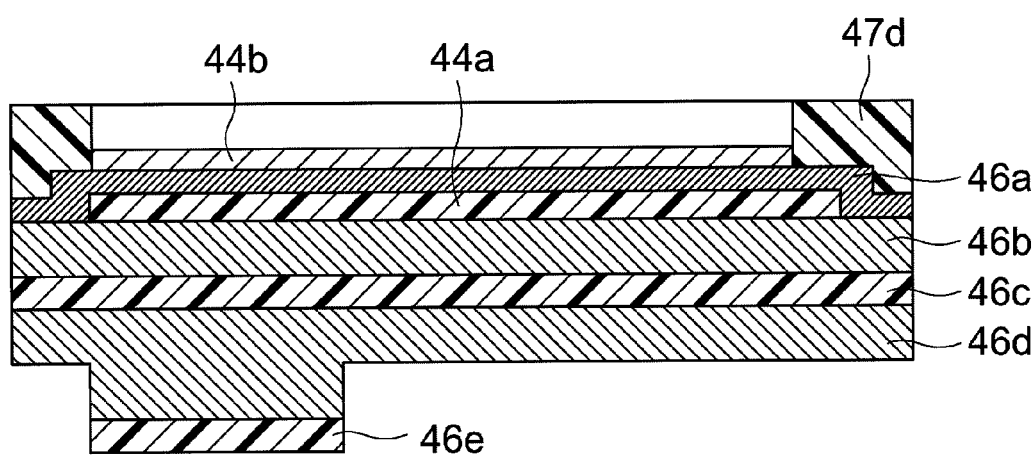
FIG. 22 is a cross-sectional view of an SOI wafer at a 13th step of the method of production of a probe according to the first embodiment of the present invention.

Next, at a 13th step shown in FIG. 22, the parts of the seed layer 44a not covered by the fourth resist layer 47d are plated to form a first interconnect layer 44b.

Figure 23A:
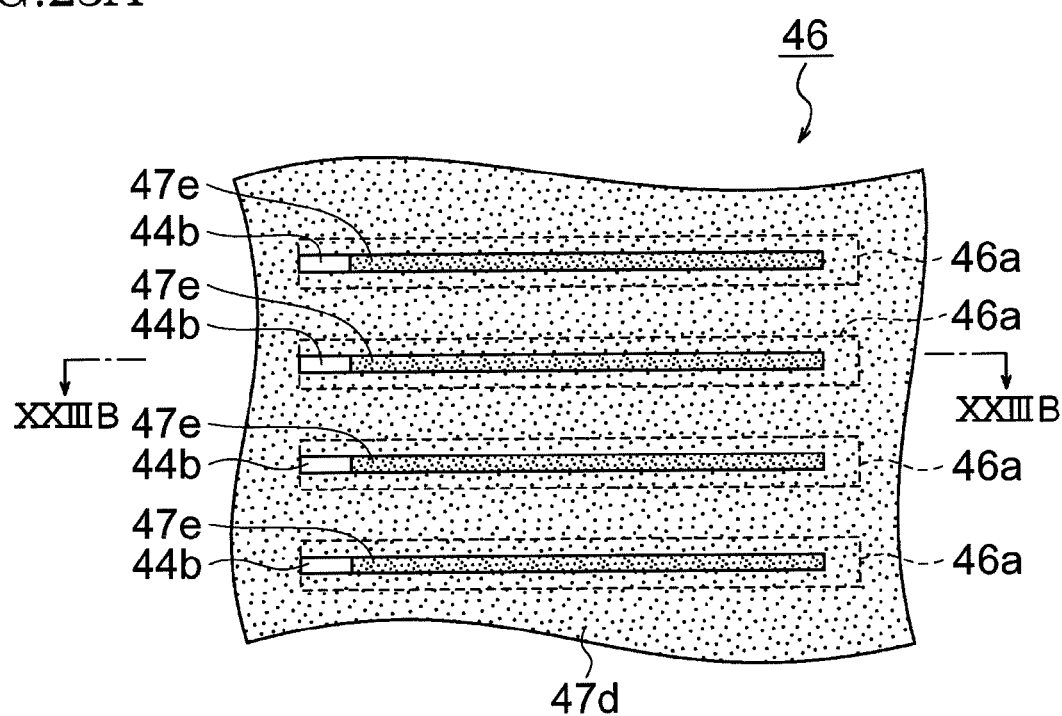
FIG. 23A is a plan view seen from the top of an SOI wafer at a 14th step of a method of production of a probe according to the first embodiment of the present invention.
Figure 23B:
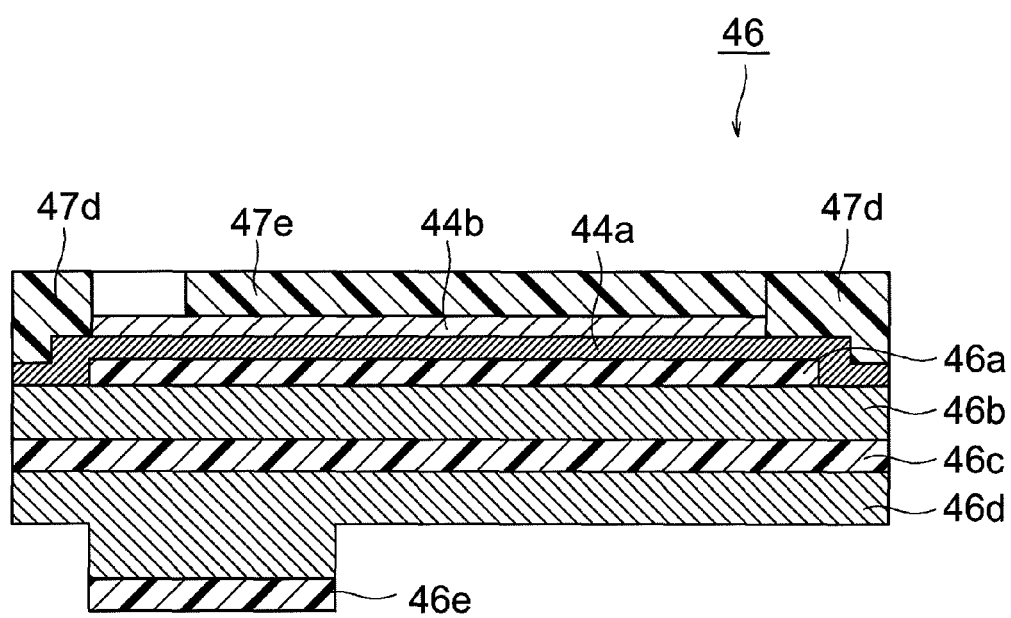
FIG. 23B is a cross-sectional view along the line XXIIIB-XXIIIB of FIG. 23A.

Next, at a 14th step shown in FIG. 23A and FIG. 23B, in the state with the fourth resist layer 47d left on the seed layer 44a, a fifth resist layer 47e is formed. This fifth resist layer 47e, as shown in FIG. 23A, is formed the whole of the first interconnect layer 44b except for the part of the back end side of the first interconnect layer 44b.

Figure 24:
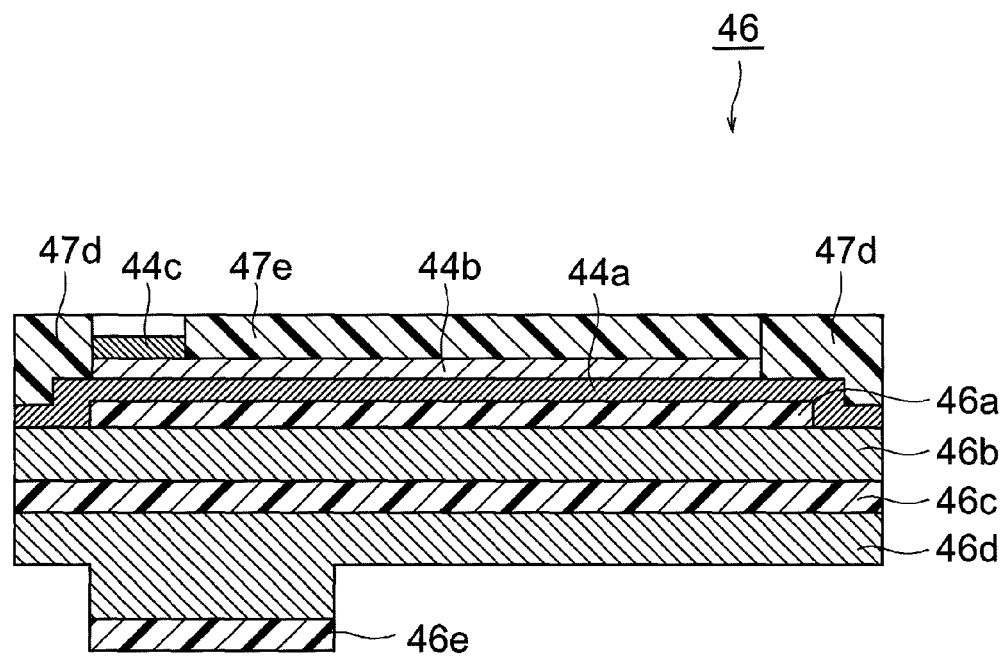
FIG. 24 is a cross-sectional view of an SOI wafer at a 15th step of the method of production of a probe according to the first embodiment of the present invention.
Figure 25A:
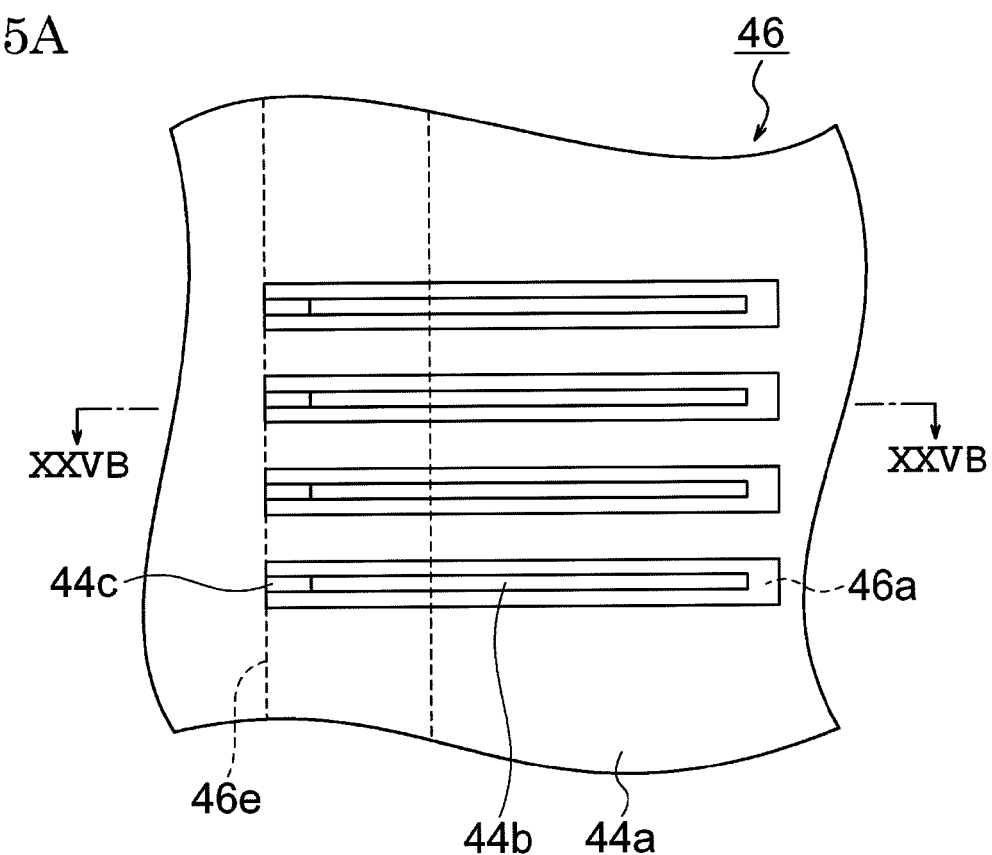
FIG. 25A is a plan view seen from the top of an SOI wafer at a 16th step of the method of production of a probe according to the first embodiment of the present invention.
Figure 25B:
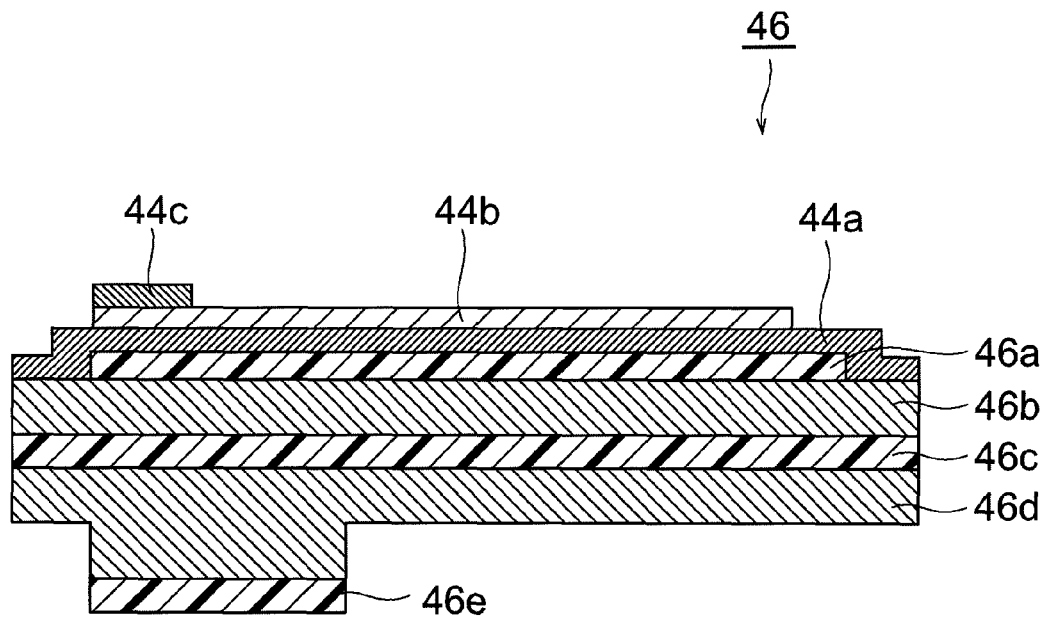
FIG. 25B is a cross-sectional view along the line XXVB-XXVB of FIG. 25A.

Next, at a 15th step shown in FIG. 24, the parts of the surface of the first interconnect layer 44b not covered by the resist layers 47d and 47e are plated to form the second interconnect layer 44c, while at a 16th step shown in FIG. 25A and FIG. 25B, the resist layers 47d and 47e are removed by a procedure similar to the above-mentioned fourth step.

Figure 26A:
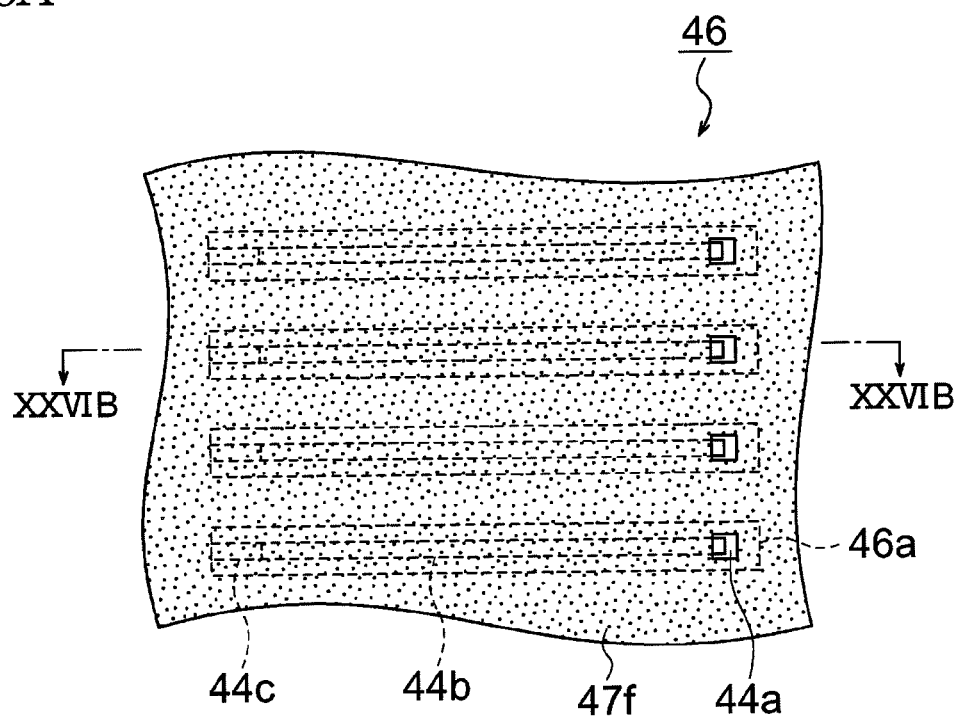
FIG. 26A is a plan view seen from the top of an SOI wafer at a 17th step of the method of production of a probe according to the first embodiment of the present invention.
Figure 26B:
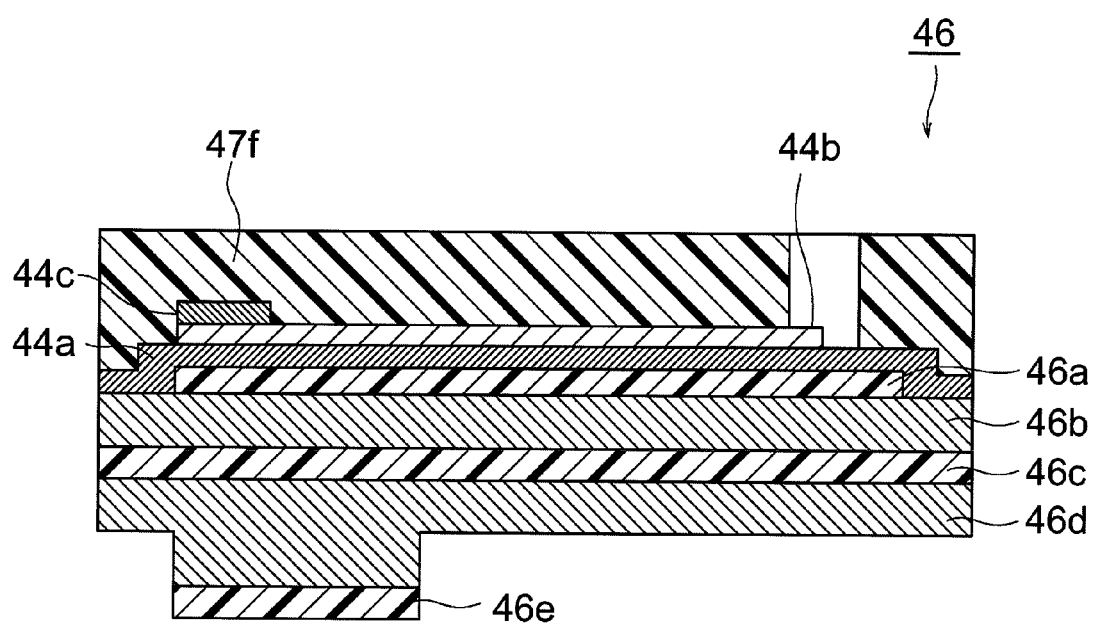
FIG. 26B is a cross-sectional view along the line XXVIB-XXVIB of FIG. 26A.

Next, at a 16th step shown in FIG. 26A and FIG. 26B, except for the regions from the front end part of the first interconnect layer 44b to the surface of the seed layer 44a, a sixth resist layer 47f is formed on the entire SOI wafer 46 by a similar procedure as the above-mentioned fourth step. Note that, this sixth resist layer 47f is for forming a first contact layer 45a at a next 17th step, but the first contact layer 45a accounts for the major part of the contact part 45 in the height direction, so at this 16th step, the sixth resist layer 47f is formed sufficiently thick.

Figure 27:
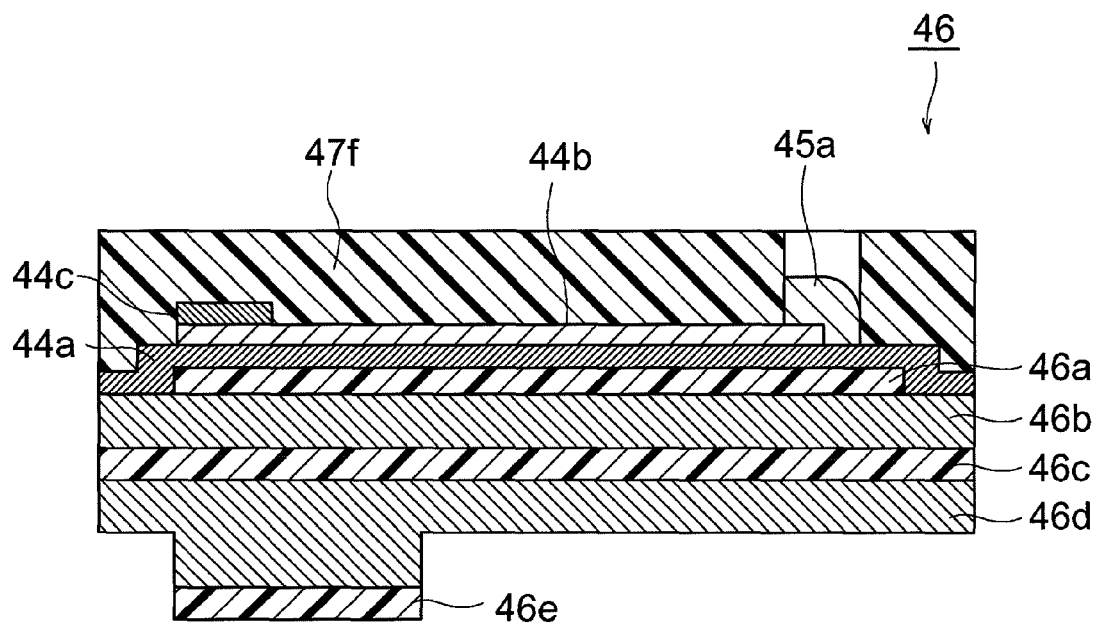
FIG. 27 is a cross-sectional view of an SOI wafer at an 18th step of the method of production of a probe according to the first embodiment of the present invention.
Figure 28A:
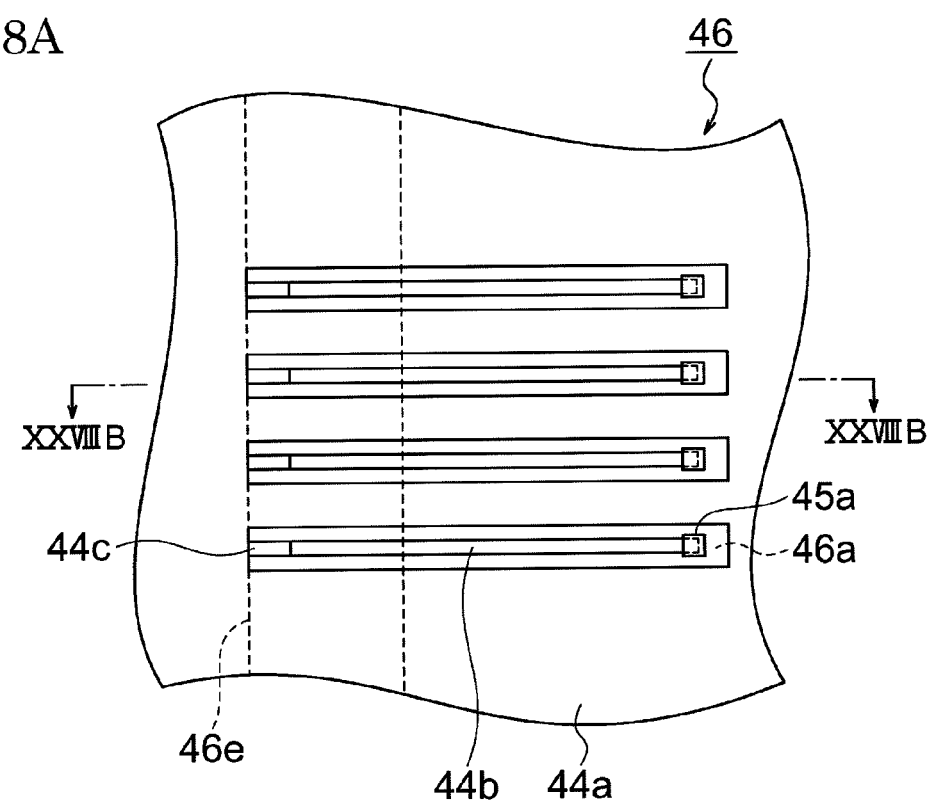
FIG. 28A is a plan view seen from the top of an SOI wafer at a 19th step of the method of production of a probe according to the first embodiment of the present invention.
Figure 28B:
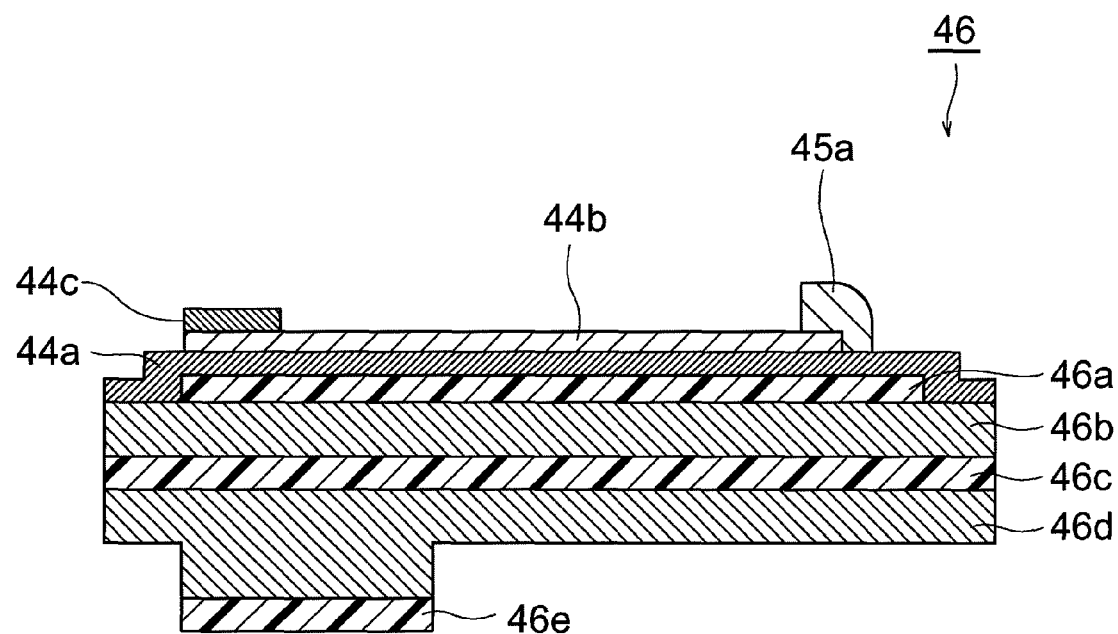
FIG. 28B is a cross-sectional view along the line XXVIIIB-XXVIIIB of FIG. 28A.

Next, at an 18th step shown in FIG. 27, the parts not covered by the sixth resist layer 47f are plated to form the first contact layer 45a. This Ni plating layer 45a is formed at a step portion between the first interconnect layer 44b and the seed layer 44a, so, as shown in FIG. 27, is formed into a curved shape. Next, at a 19th step shown in FIG. 28A and FIG. 28B, the sixth resist layer 47f is removed by a similar procedure as in the above-mentioned fourth step.

Figure 29A:
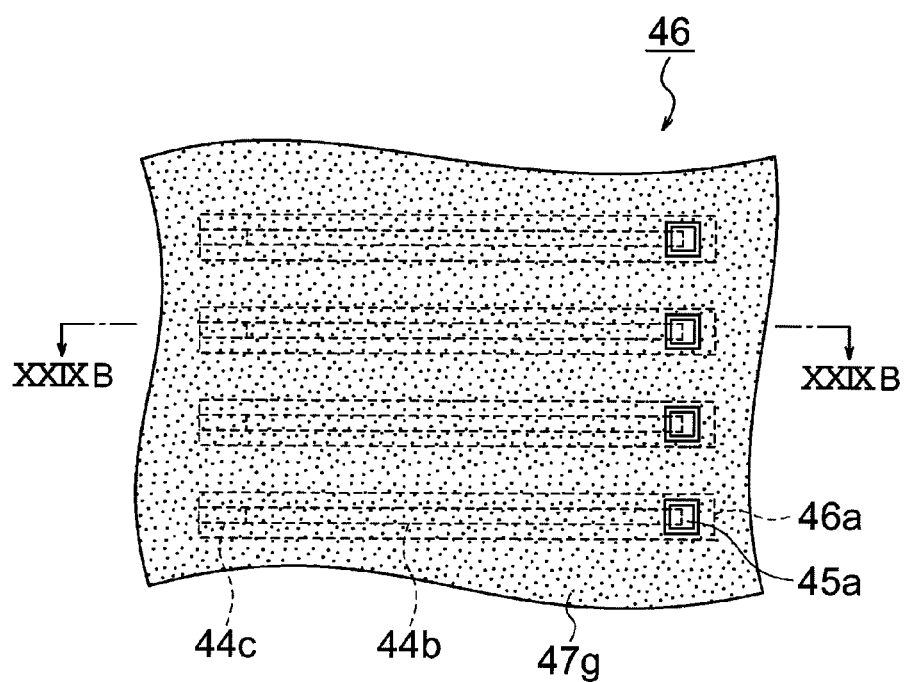
FIG. 29A is a plan view seen from the top of an SOI wafer at a 20th step of the method of production of a probe according to the first embodiment of the present invention.
Figure 29B:
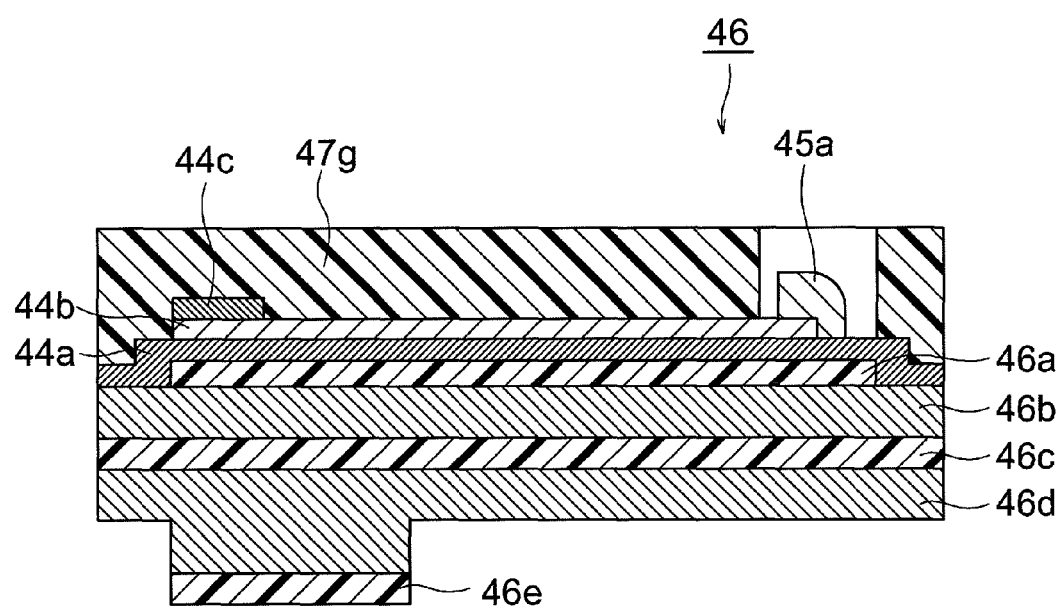
FIG. 29B is a cross-sectional view along the line XXIXB-XXIXB of FIG. 29A.

Next, at a 20th step shown in FIG. 29A and FIG. 29B, in a state leaving some space around the first contact layer 45a, a seventh resist layer 47g is formed on the entire surface of the SOI wafer 46 by a procedure similar to the above-mentioned second step.

Figure 30:
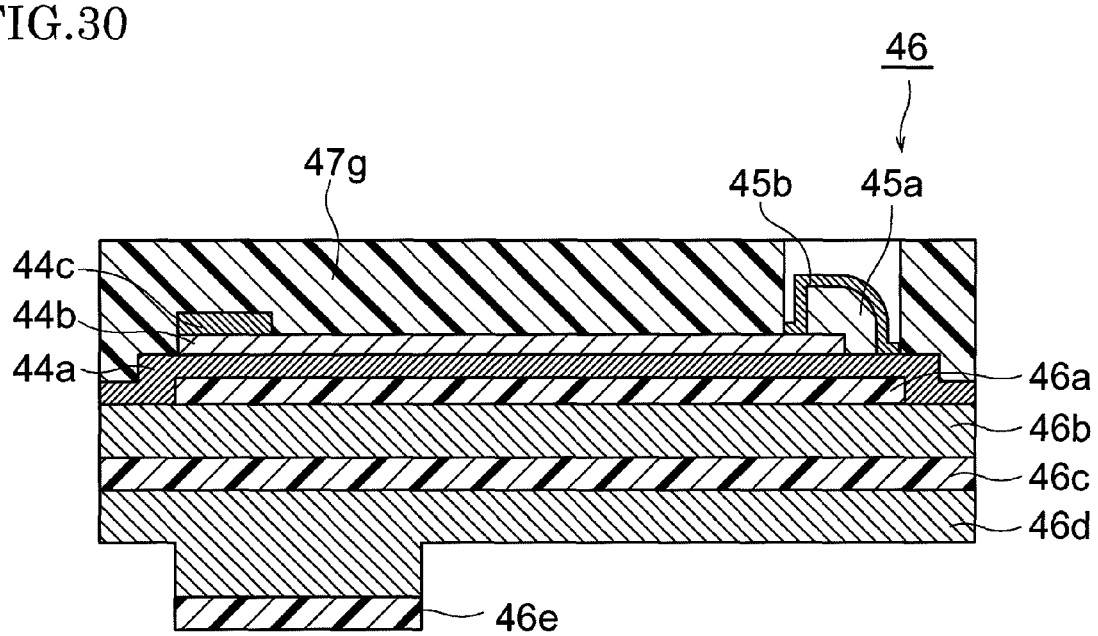
FIG. 30 is a cross-sectional view of an SOI wafer at a 21st step of the method of production of a probe according to the first embodiment of the present invention.

Next, at a 21st step shown in FIG. 30, the parts of the top surface of the SOI wafer 46 not covered by the seventh resist layer 47g are plated with gold to form a second contact layer 45b so as to envelop the first contact layer 45a. Incidentally, this second contact layer 45b is formed for protecting the first contact layer 45a from the plating solution used at the next step when forming a third contact layer 45c by rhodium plating.

Figure 31:
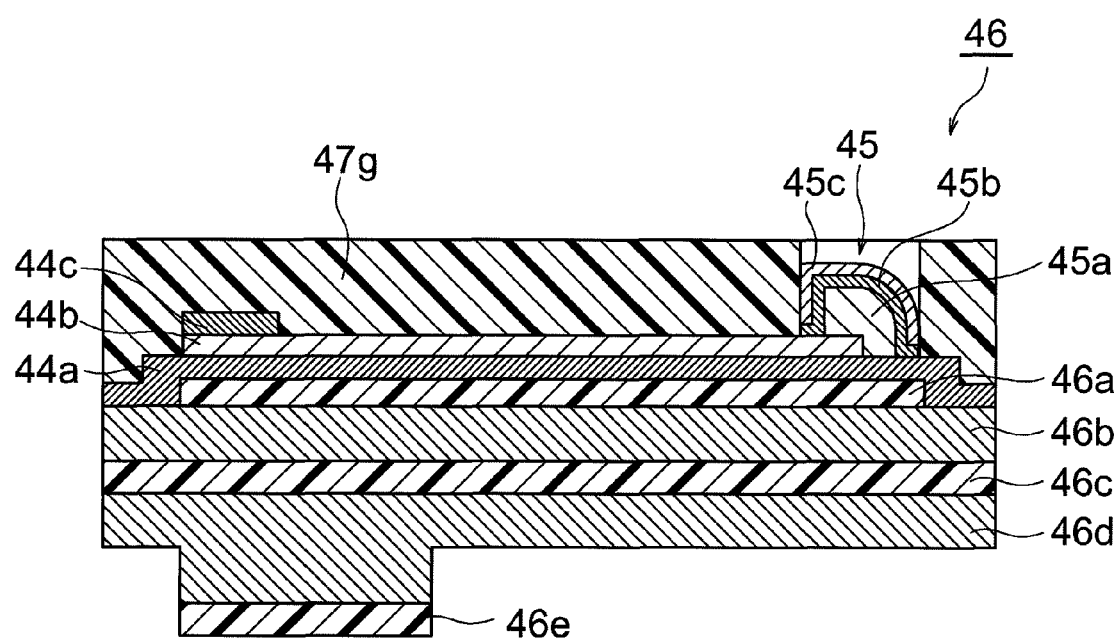
FIG. 31 is a cross-sectional view of an SOI wafer at a 22nd step of the method of production of a probe according to the first embodiment of the present invention.
Figure 32A:
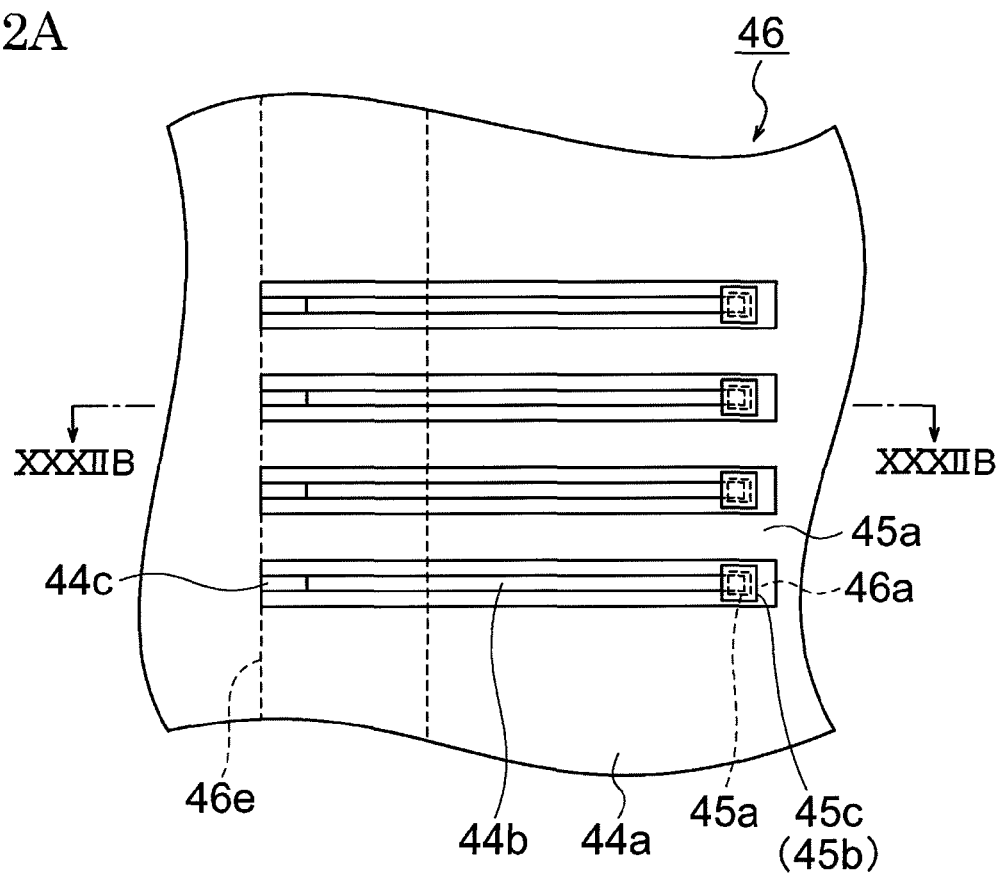
FIG. 32A is a plan view seen from the top of an SOI wafer at a 23rd step of the method of production of a probe according to the first embodiment of the present invention.
Figure 32B:
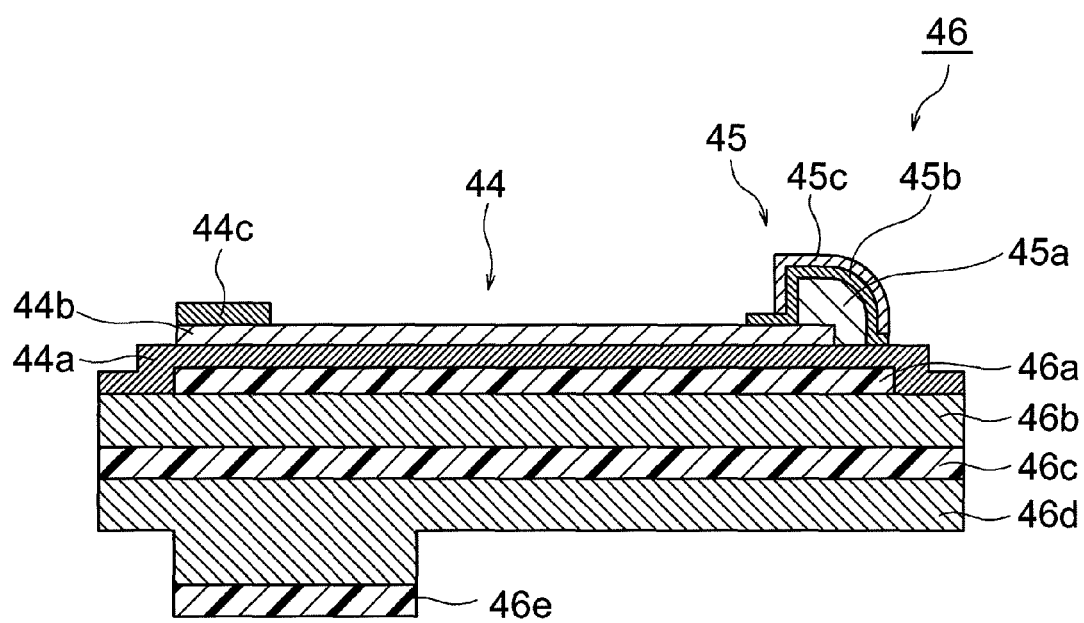
FIG. 32B is a cross-sectional view along the line XXXIIB-XXXIIB of FIG. 32A.

Next, at a 22nd step shown in FIG. 31, in a state leaving the seventh resist layer 47g, the parts of the top surface of the SOI wafer 46 not covered by the seventh resist layer 47g are plated by rhodium to form the third contact layer 45c so as to envelop the second contact layer 45b. Next, at a 23rd step shown in FIG. 32A and FIG. 32B, the seventh resist layer 47g is removed by a procedure similar to the above-mentioned fourth step. The third contact layer 45c has a high hardness (for example, when the third contact layer 45c is made of rhodium, Hv800 to 1000) and is superior in corrosion resistance, so is suitable for the surface of a contact part 45 where long term stable contact resistance and abrasion resistance are demanded.

Figure 33:
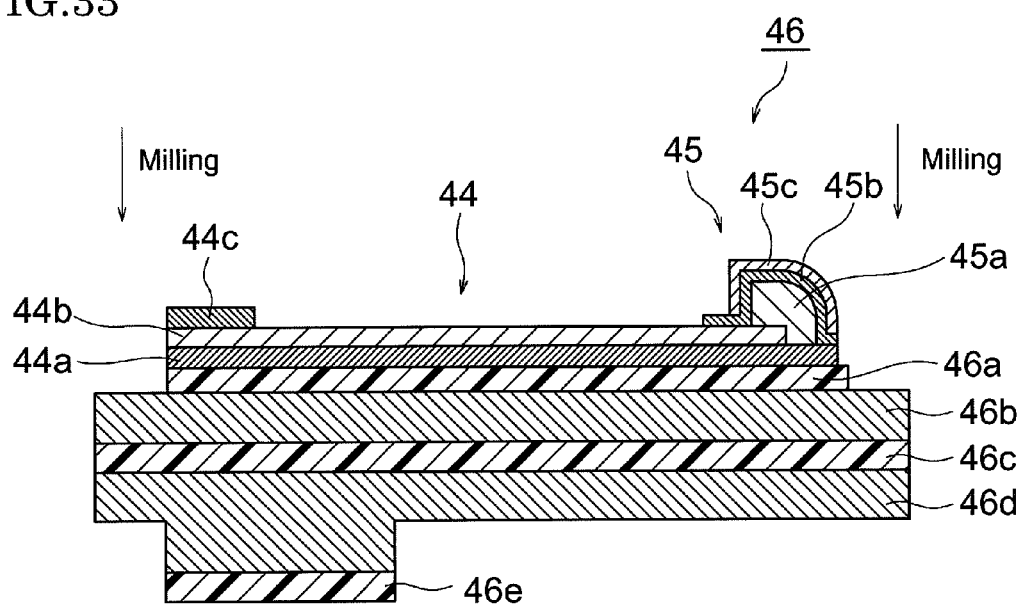
FIG. 33 is a cross-sectional view of an SOI wafer at a 24th step of the method of production of a probe according to the first embodiment of the present invention.

Next, at a 24th step shown in FIG. 33, the exposed parts of the seed layer 44a which functioned as the power feed layer when forming the first interconnect layer 44b by plating is removed by milling. This milling is performed in a vacuum chamber by making argon ions strike the top surface of the SOI wafer 46. At this time, since the seed layer 44a is thinner than the other layers, it is first removed by this milling. Due to this milling, only the parts of the seed layer 44a positioned under an interconnect part 44 and a contact part 45 remain and the other parts are removed.

Figure 34A:
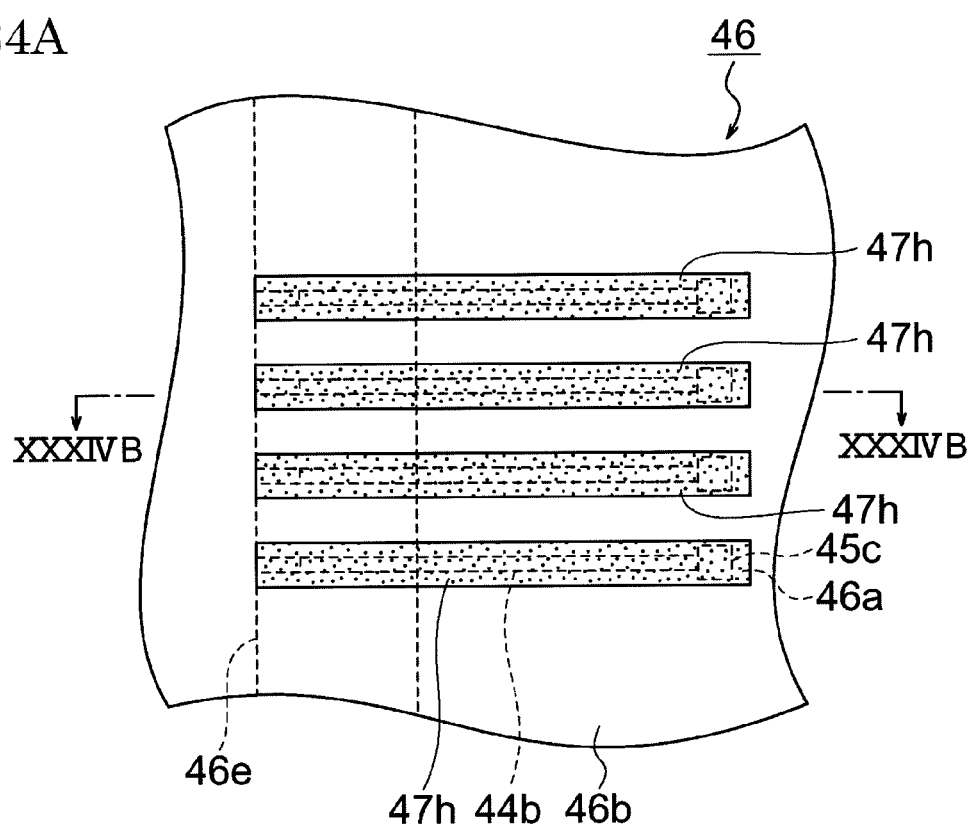
FIG. 34A is a plan view seen from the top of an SOI wafer at a 25th step of the method of production of a probe according to the first embodiment of the present invention.
Figure 34B:
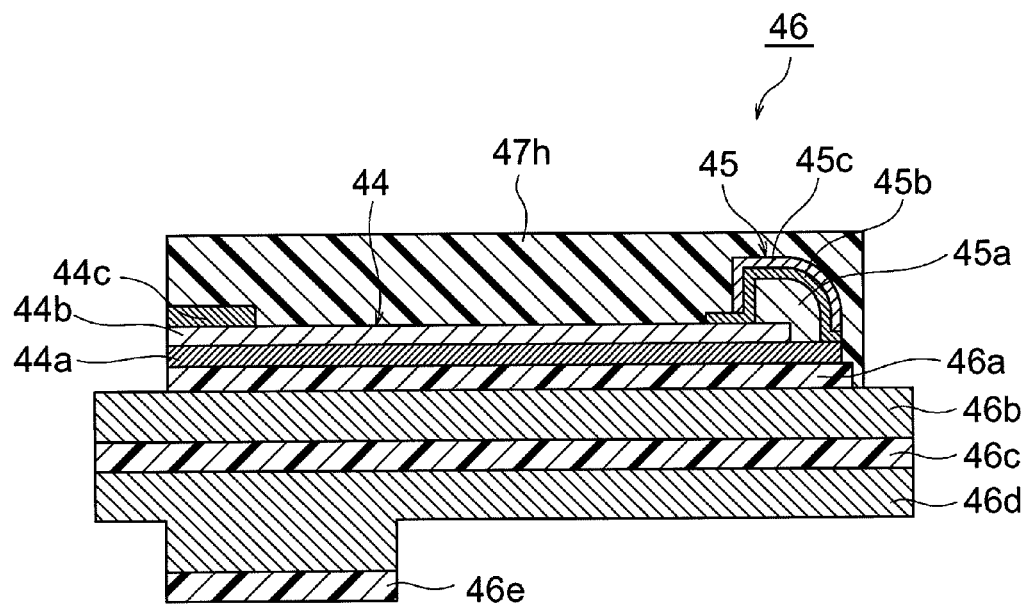
FIG. 34B is a cross-sectional view along the line XXXIVB-XXXIVB of FIG. 34A.

Next, at a 25th step shown in FIG. 34A and FIG. 34B, a plurality of strip shapes of an eighth resist layer 47h are formed on the first SiO₂ layer 46a by a similar procedure as the above-mentioned second step.

Figure 35:
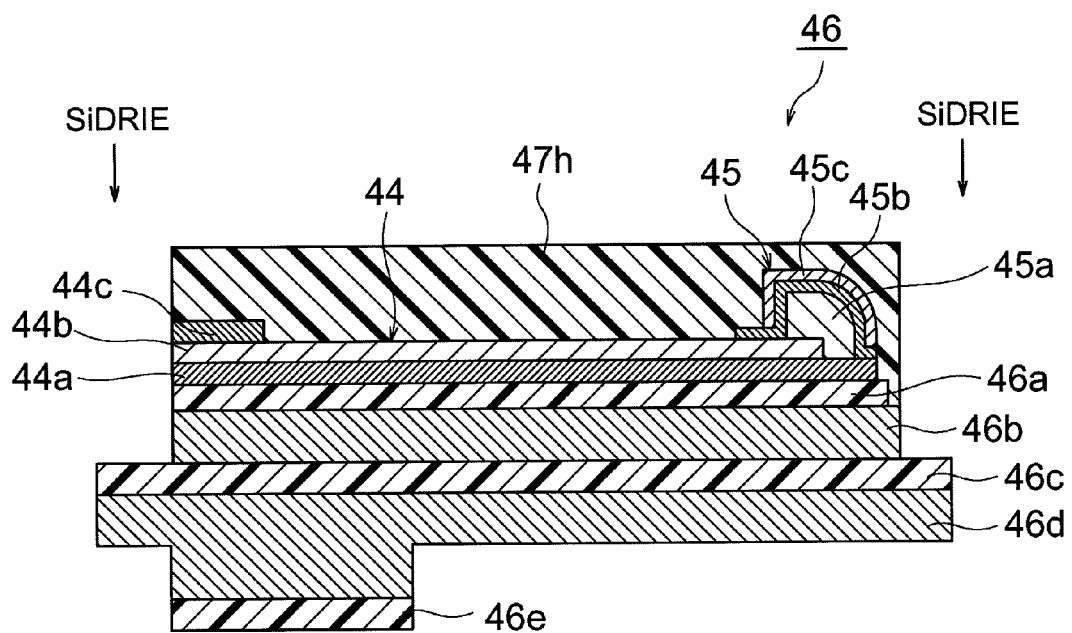
FIG. 35 is a cross-sectional view of an SOI wafer at a 26th step of the method of production of a probe according to the first embodiment of the present invention.

Next, at a 26th step shown in FIG. 35, the active layer (Si layer) 46b is etched from the top of the SOI wafer 46. As specific means for this etching, for example the DRIE method etc. may be mentioned. Due to this etching, the active layer 46b is eaten away into a plurality of strip shapes. Note that, this DRIE does not eat into the SOI wafer 46 down to the support layer (Si layer) 46d since the BOX layer (SiO₂ layer) 46c functions as an etching stopper.

Further, this etching is performed so that a scallop value of a beam part 42 (roughness of surface relief of side wall surface formed by etching) becomes 100 nm or less. Due to this, when the beam part 42 elastically deforms, it is possible to prevent cracks from occurring starting from rough parts of the side wall surface.

Figure 36A:
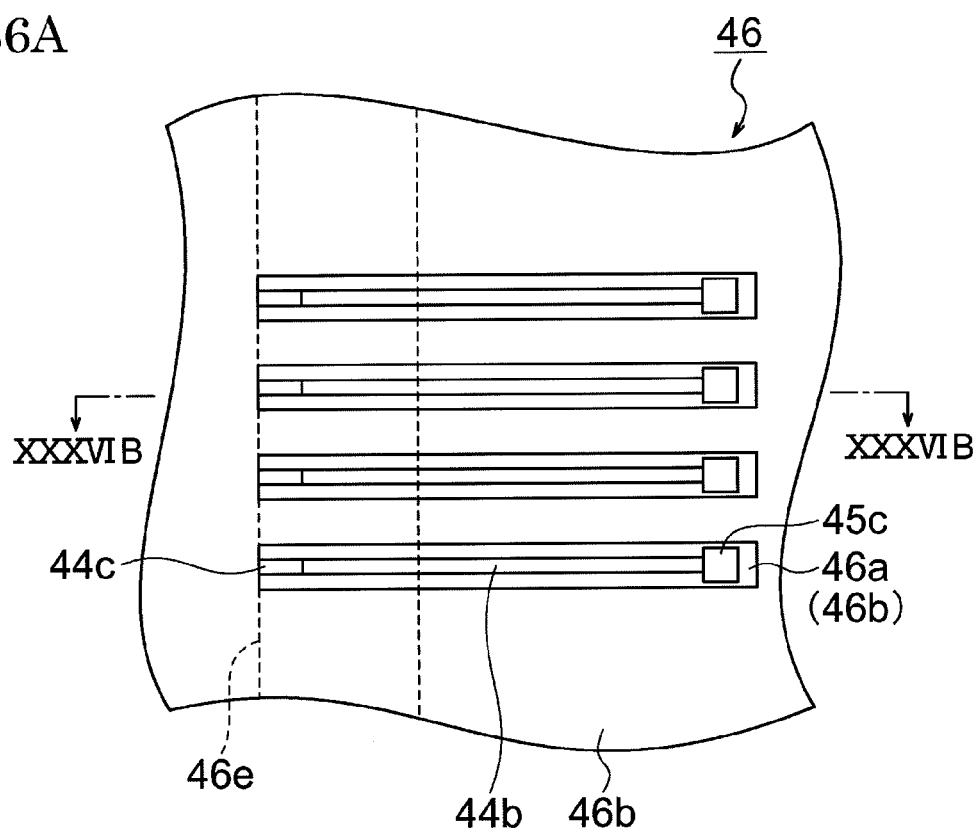
FIG. 36A is a plan view seen from the top of an SOI wafer at a 27th step of the method of production of a probe according to the first embodiment of the present invention.
Figure 36B:
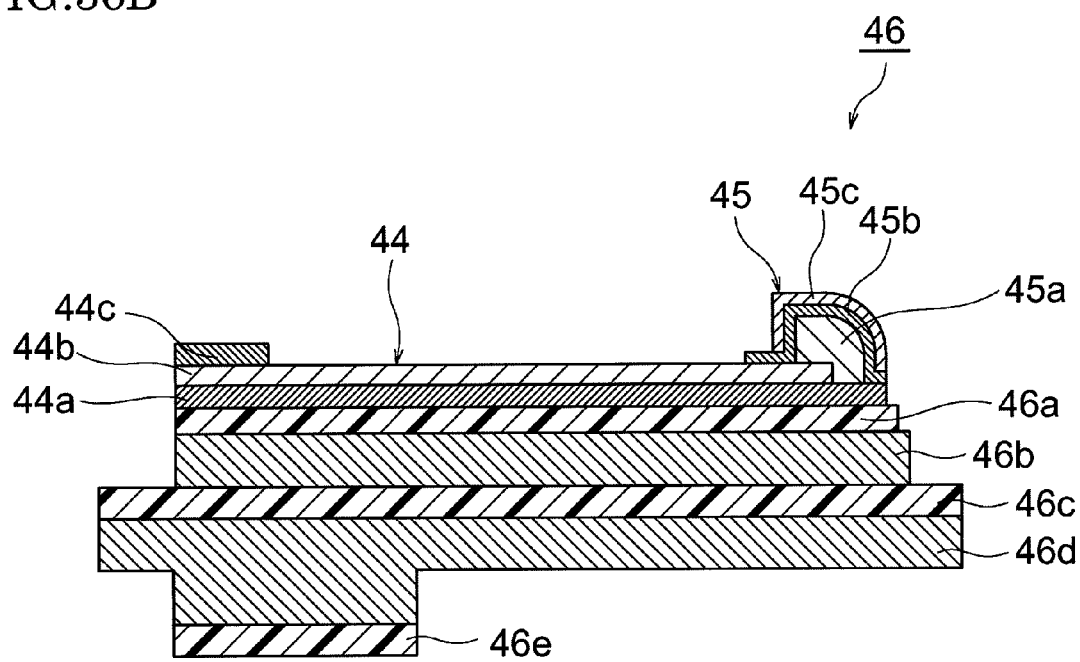
FIG. 36B is a cross-sectional view along the line XXXVIB-XXXVIB of FIG. 36A.
Figure 37:
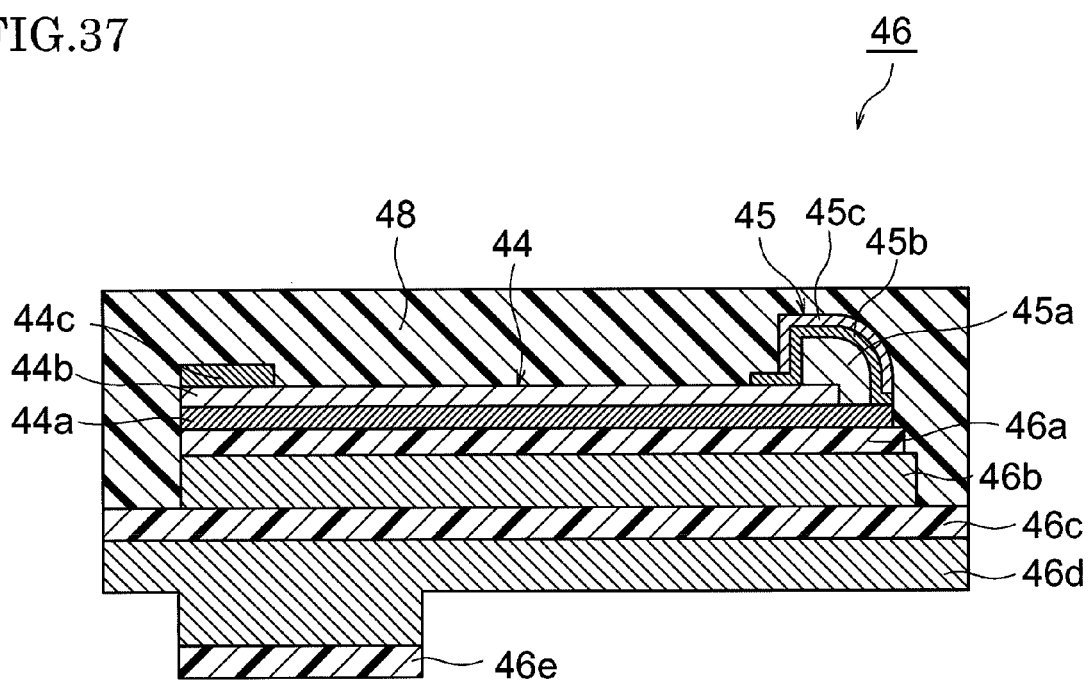
FIG. 37 is a cross-sectional view of an SOI wafer at a 28th step of the method of production of a probe according to the first embodiment of the present invention.

Next, at a 27th step shown in FIG. 36A and FIG. 36B, a similar procedure as the above-mentioned fourth step is used to remove the eighth resist layer 47h. Next, at a 28th step shown in FIG. 37, a polyimide film 48 is formed on the entire top surface of the SOI wafer 46. This polyimide film 48 is formed by coating a polyimide precursor using a spin coater or spray coater etc. on the entire top surface of the SOI wafer 46, then heating to 20° C. or higher or using a catalyst to cause imidization. This polyimide film 48 is formed for preventing coolant from leaking by exposure of a stage of the etching apparatus via through holes or for preventing the stage itself from damaging at the time of etching in the next step and the next next step.

Figure 38:
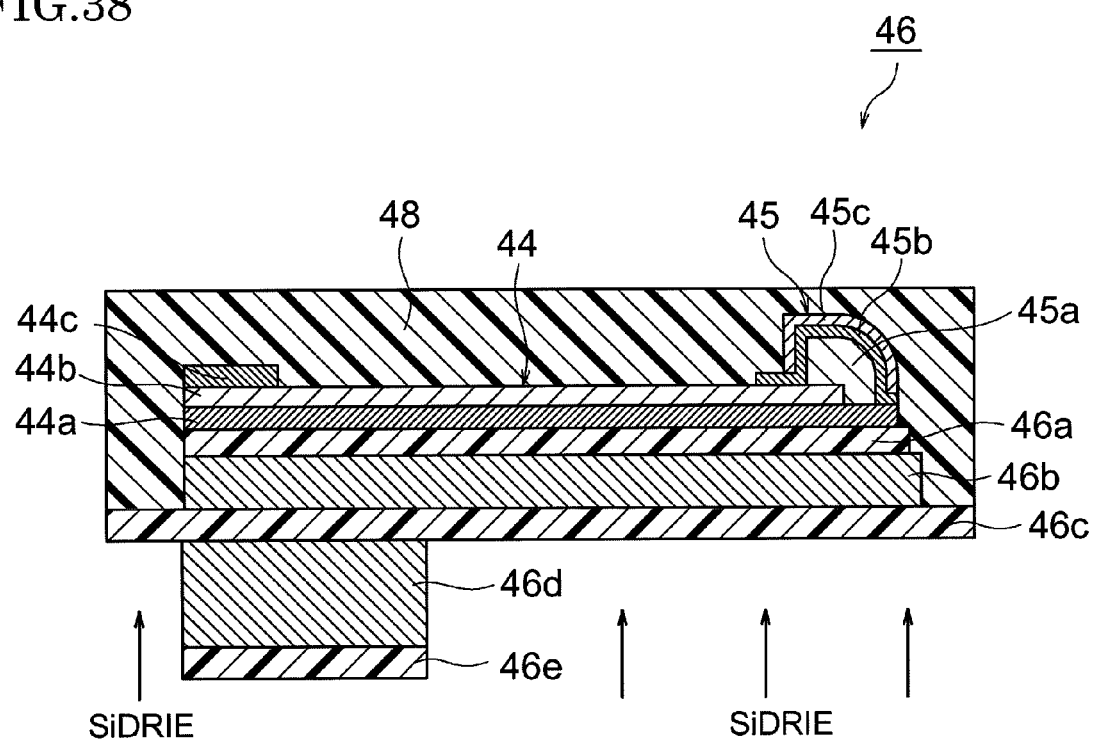
FIG. 38 is a cross-sectional view of an SOI wafer at a 29th step of the method of production of a probe according to the first embodiment of the present invention.

Next, at a 29th step shown in FIG. 38, the support layer (Si layer) 46d is etched from the bottom of the SOI wafer 46. As a specific example of this etching, for example, the DRIE method etc. may be mentioned. In this etching process, the second SiO₂ layer 46e remaining at the above-mentioned third step functions as a mask material. Note that, this DRIE does not eat into the SOI wafer 46 down to the active layer (Si layer) 46b since the BOX layer (SiO₂ layer) 46c functions as an etching stopper.

Figure 39A:
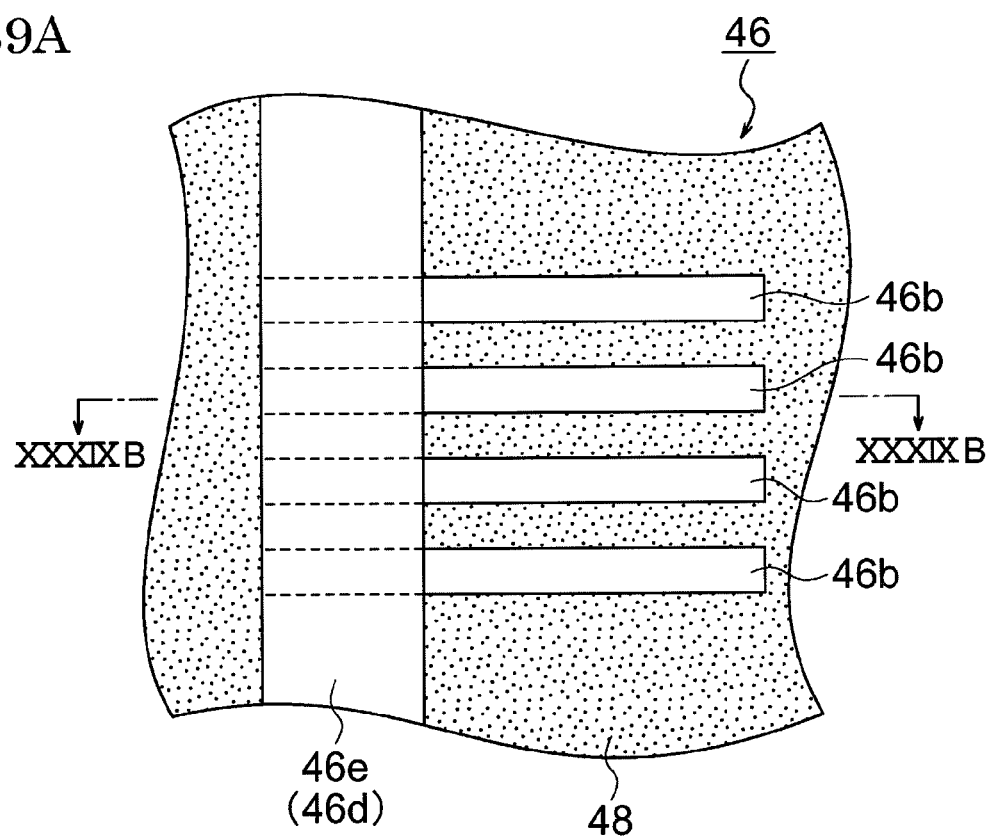
FIG. 39A is a plan view seen from the bottom of an SOI wafer in a 30th step of the method of production of a probe according to the first embodiment of the present invention.
Figure 39B:
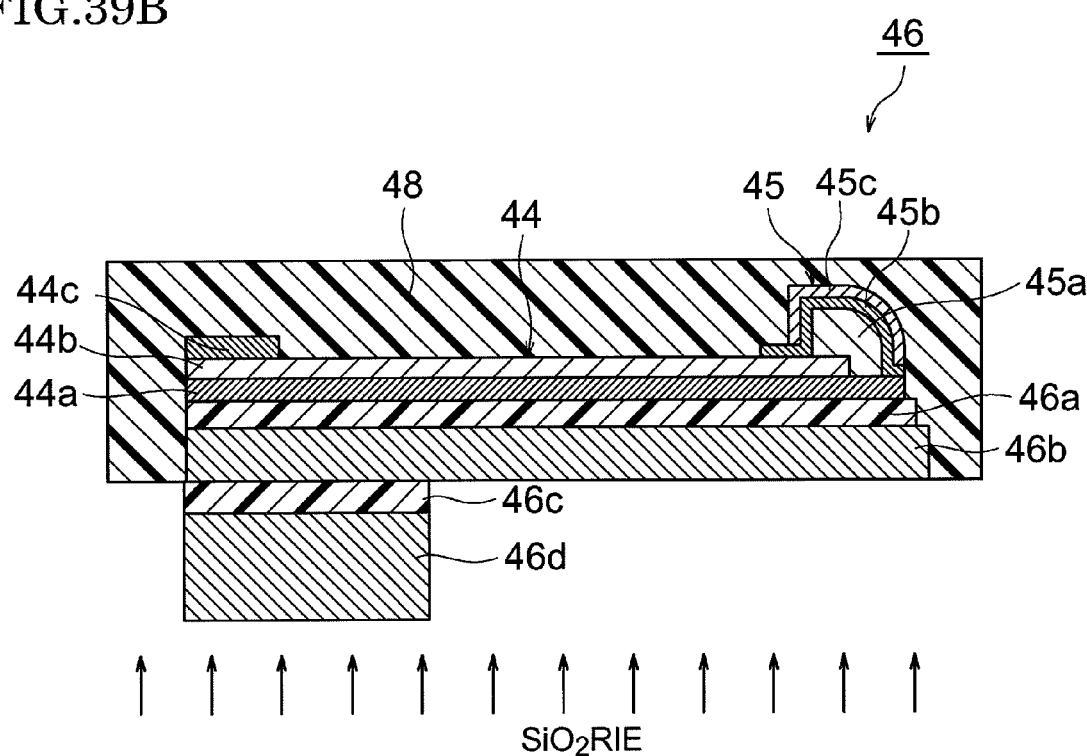
FIG. 39B is a cross-sectional view along the line XXXIXB-XXXIXB of FIG. 39A.

Next, at a 30th step shown in FIG. 39A and FIG. 39B, the two SiO₂ layers 46c and 46e are etched from the bottom of the SOI wafer 46. As specific means for this etching, the RIE method etc. may be mentioned. As shown in FIG. 39A, due to this etching, the beam parts 42 are formed into complete finger shapes.

Figure 40:
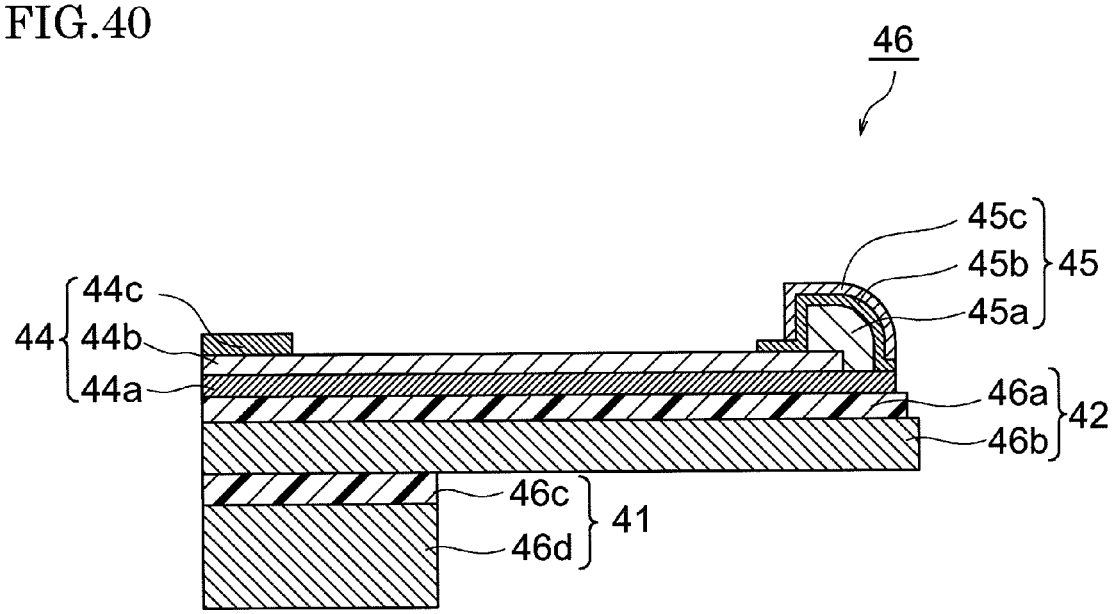
FIG. 40 is a cross-sectional view of an SOI wafer at a 31st step of the method of production of a probe according to the first embodiment of the present invention.

Next, at a 31st step shown in FIG. 40, the unnecessary polyimide film 48 is removed by a strongly alkaline peeling solution. Note that, in the present embodiment, the polyimide precursor directly coated on the wafer 46 is imidized so as to form the polyimide film 48, but the present invention is not particularly limited to this. For example, as the polyimide film 48, it is also possible to use an alkali soluble tackifier to stick a polyimide film on the wafer 46.

Figure 41:
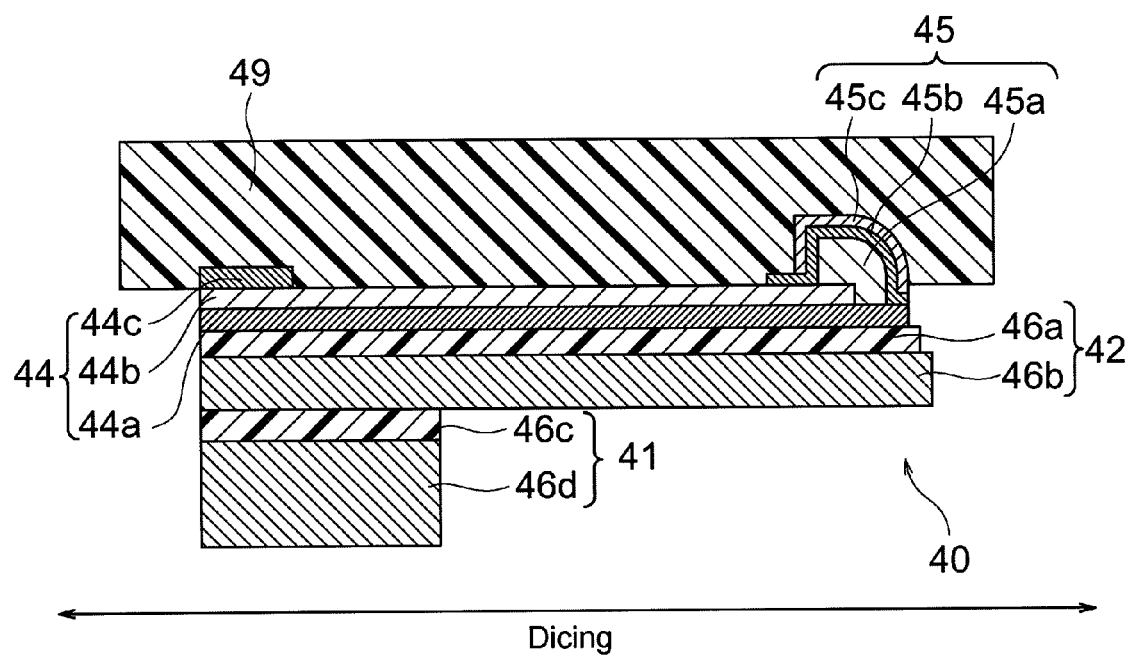
FIG. 41 is a cross-sectional view of an SOI wafer at a 32nd step of the method of production of a probe according to the first embodiment of the present invention.

Next, at a 32nd step shown in FIG. 41, a foam peeling tape 49 is adhered on the top surface of the SOI wafer 46, and the SOI wafer 46 is diced along a longitudinal direction of the beam parts 42 in units of predetermined numbers of beam parts 42. Note that, the foam peeling tape 49 is adhered for protecting the beam parts 42 from water pressure at the time of dicing.

This foam peeling tape 49 comprises a base tape including PET on one surface of which a UV foaming tackifier is coated. This foam peeling tape 49 is adhered to the SOI wafer 46 by the UV foaming tackifier in the state not yet irradiated by UV rays, but when irradiated by UV rays, the UV foaming tackifier foams, the tackiness falls, and the tape can be easily peeled off from the SOI wafer 46.

Figure 42:
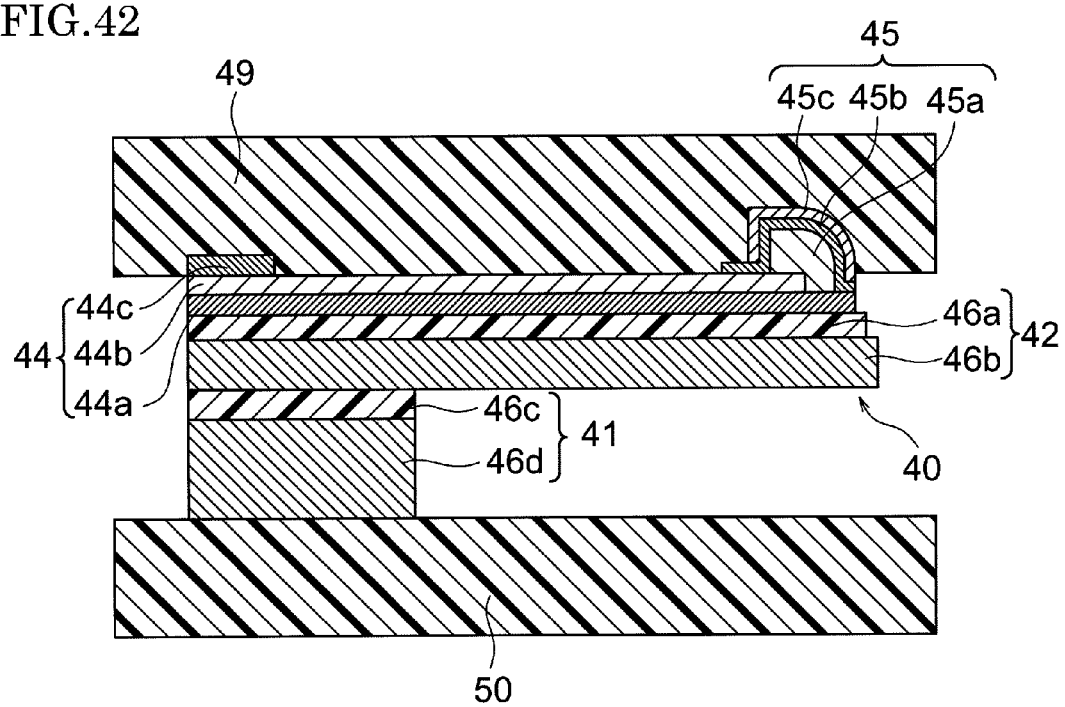
FIG. 42 is a cross-sectional view of a probe at a 33rd step of the method of a probe according to the first embodiment of the present invention.

Next, at a 33rd step shown in FIG. 42, in order to enable a diced probe 40 to be handled from above by a pickup system, UV peeling type tape 50 is adhered to the bottom surface of a base part 41.

This UV peeling type tape 50 comprises a base tape including a polyolefin on one surface of which a UV curing type tackifier is coated. This UV peeling type tape 50 is adhered to the bottom surface of a base part 41 by the UV curing type tackifier in the state not yet irradiated by UV rays, but when irradiated by UV rays, the UV curing type tackifier loses its tackiness and the tape can be easily peeled off from the base part 41.

Figure 43:
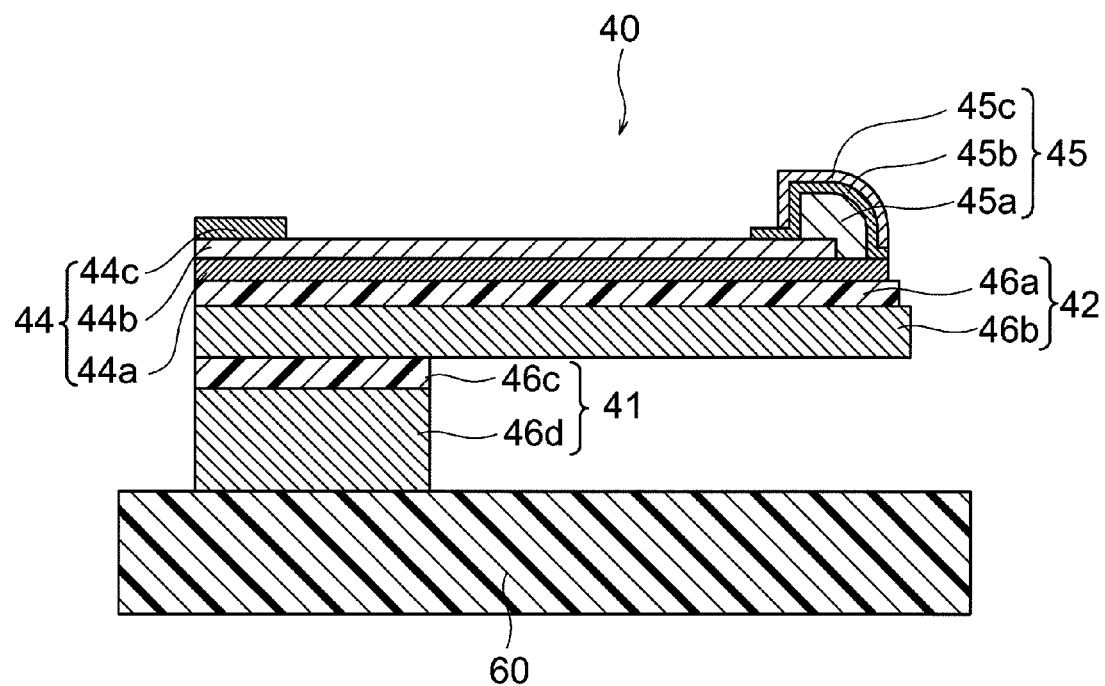
FIG. 43 is a cross-sectional view of a probe at a 34th step of the method of a probe according to a first embodiment of the present invention.

Next, at a 34th step shown in FIG. 43, UV rays are irradiated toward the foam peeling tape 49 to make the UV foaming tackifier of the foam peeling tape 49 foam, and the foam peeling tape 49 is peeled off from a probe 40 to thereby transfer the probe 40 from the foam peeling tape 49 to the UV peeling type tape 50.

Next, while not particularly illustrated, in the state with the pickup system holding a probe 40, UV rays are irradiated toward the UV curing type peeling tape 50 and that tape 50 is peeled from the probe 40. Further, the pickup system places the probe 40 at a predetermined position of the probe board 30 and fixes it by the binder 31d whereby the probe 40 is mounted on the probe board 30.

Note that, the embodiments explained above were described for facilitating understanding of the present invention and were not described for limiting the present invention. Therefore, the elements disclosed in the above embodiments include all design changes and equivalents falling under the technical scope of the present invention.

What is claimed is:

1. A probe for contacting input/output terminals of a device under test for establishing an electrical connection between the device under test and a test system when testing the device under test, the probe comprising:
   conductive parts to be electrically connected with the input/output terminals of the device under test;
   a plurality of beam parts, each beam part having a one side main surface on which each conductive part is provided; and
   a base part supporting the plurality of beam parts all together in a cantilever fashion, wherein
   the conductive part includes:
      an interconnect part provided on the one side main surface of the beam part along a longitudinal direction of the beam part; and
      a contact part provided at a front end of the interconnect part so as to project upright from the interconnect part,
   the plurality of beam parts are supported by the base part at a rear region of the plurality of beam parts,
   a plurality of slots penetrate between adjoining beam parts in a front region of the plurality of beam parts,
   a plurality of grooves are provided between adjoining beam parts in the rear region and are connected with the plurality of slots,
   each groove opens toward the slot at a front end side
   each groove has a bottom surface, side walls, and a terminating end wall between a frontmost end and a rearmost end in the rear region, and
   each groove is defined by its respective front end side, bottom surface, side walls and terminating end wall so as to terminate before the rearmost end of the rear region.

2. The probe as set forth in claim 1, wherein the one side main surfaces of the adjoining beam parts are connected through a flat surface in a portion between the terminating end wall of the groove and the rearmost end of the rear region.

3. The probe as set forth in claim 1, wherein a corner part between the terminating end wall and the side wall of the groove is formed in one of a tapered shape and a curved shape.

4. The probe as set forth in claim 2, wherein
- a pitch between adjoining interconnect parts widens on the flat surface.

5. A probe card comprising:
- the probe as set forth in claim 1;
- a board; and
- an adhesive through which the base part of the probe is fixed to the board.

6. The probe as set forth in claim 1, wherein
the contact part includes:
- a first contact layer projecting from a step formed by the interconnect part;
- a second contact layer formed on the first contact layer; and
- a third contact layer formed on the second contact layer.

* * * * *